United States Patent
Horii et al.

(10) Patent No.: US 11,393,980 B2
(45) Date of Patent: Jul. 19, 2022

(54) VARIABLE RESISTANCE MEMORY DEVICES IMPLEMENTING TWO-DIMENSIONAL TRANSITION METAL DICHALCOGENIDE MATERIALS

(71) Applicant: SAMSUNG ELECTRONICS CO., LTD., Suwon-si (KR)

(72) Inventors: Hideki Horii, Seoul (KR); Jungmoo Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 19 days.

(21) Appl. No.: 16/898,686

(22) Filed: Jun. 11, 2020

(65) Prior Publication Data

US 2021/0167285 A1 Jun. 3, 2021

(30) Foreign Application Priority Data

Dec. 2, 2019 (KR) .......................... 10-2019-0158255

(51) Int. Cl.
*H01L 45/00* (2006.01)

(52) U.S. Cl.
CPC ........ *H01L 45/1273* (2013.01); *H01L 45/142* (2013.01); *H01L 45/143* (2013.01); *H01L 45/144* (2013.01)

(58) Field of Classification Search
CPC . H01L 45/1273; H01L 45/144; H01L 45/142; H01L 45/143; H01L 45/122; H01L 45/1253
See application file for complete search history.

(56) References Cited

U.S. PATENT DOCUMENTS

| | | | |
|---|---|---|---|
| 8,071,968 B2 | 12/2011 | Chang | |
| 9,231,199 B2 | 1/2016 | Lee et al. | |
| 10,134,628 B2 | 11/2018 | Song et al. | |
| 10,217,513 B2 | 2/2019 | Lee et al. | |
| 2014/0291599 A1 | 10/2014 | Hwang | |
| 2015/0155374 A1* | 6/2015 | Byun | H01L 29/78 257/192 |
| 2017/0069837 A1* | 3/2017 | Choi | G06F 3/0688 |
| 2017/0243922 A1* | 8/2017 | Eun | H01L 23/528 |
| 2019/0123273 A1 | 4/2019 | Lee et al. | |
| 2019/0131520 A1 | 5/2019 | Morin et al. | |
| 2019/0363250 A1* | 11/2019 | Appenzeller | G11C 13/0007 |
| 2020/0013951 A1* | 1/2020 | Wu | H01L 45/126 |
| 2020/0027504 A1* | 1/2020 | Sharma | H01L 45/08 |
| 2020/0075676 A1* | 3/2020 | Salahuddin | H01L 43/10 |
| 2021/0083181 A1* | 3/2021 | Chen | H01L 45/1666 |

FOREIGN PATENT DOCUMENTS

KR 10-2018-0022097 A 3/2018

\* cited by examiner

*Primary Examiner* — Jerome Leboeuf
(74) *Attorney, Agent, or Firm* — Lee IP Law, PC

(57) ABSTRACT

A variable resistance memory device includes a first electrode on a substrate, a variable resistance pattern on the first electrode, a second electrode on the variable resistance pattern, a selection pattern structure on the second electrode, and a third electrode on the selection pattern structure. The selection pattern structure may include a first leakage current prevention pattern and a selection pattern sequentially stacked, and the first leakage current pattern may include a two-dimensional transition metal dichalcogenide (TMDC) material.

10 Claims, 34 Drawing Sheets

VARIABLE RESISTANCE MEMORY DEVICES IMPLEMENTING TWO-DIMENSIONAL TRANSITION METAL DICHALCOGENIDE MATERIALS

CROSS-REFERENCE TO RELATED APPLICATION

Korean Patent Application No. 10-2019-0158255, filed on Dec. 2, 2019, in the Korean Intellectual Property Office, and entitled: "Variable Resistance Memory Devices," is incorporated by reference herein in its entirety.

BACKGROUND

1. Field

Example embodiments relate to a variable resistance memory device.

2. Description of the Related Art

In order to increase the integration degree of a PRAM device, the sizes of elements may be reduced.

SUMMARY

Embodiments are directed to a variable resistance memory device, including a first electrode on a substrate; a variable resistance pattern on the first electrode; a second electrode on the variable resistance pattern; a selection pattern structure on the second electrode; and a third electrode on the selection pattern structure. The selection pattern structure may include a first leakage current prevention pattern and a selection pattern sequentially stacked, and the first leakage current pattern may include a two-dimensional transition metal dichalcogenide (TMDC) material.

Embodiments are also directed to a variable resistance memory device, including a first electrode on a substrate; a memory unit including a first adiabatic pattern, a variable resistance pattern, and a second adiabatic pattern sequentially stacked on the first electrode; a second electrode on the memory unit; a selection pattern structure on the second electrode; and a third electrode on the selection pattern structure. Each of the first and second adiabatic patterns may include a two-dimensional transition metal dichalcogenide (TMDC) material.

Embodiments are also directed to a variable resistance memory device, including first conductive lines on a substrate, each of the first conductive lines extending in a first direction substantially parallel to an upper surface of the substrate, the first conductive lines being spaced apart from each other in a second direction substantially parallel to the upper surface of a substrate, and the first and second directions crossing each other; second conductive lines on the first conductive lines, each of the second conductive lines extending in the second direction, and the second conductive lines being spaced apart from each other in the first direction; and a first electrode, a memory unit, a second electrode, a selection pattern structure, and a third electrode disposed in respective areas where the first and second conductive lines overlap each other in a third direction substantially perpendicular to the upper surface of the substrate. The memory unit may include a first adiabatic pattern, a variable resistance pattern and a second adiabatic pattern sequentially stacked, the selection pattern structure may include a first leakage current prevention pattern and a selection pattern sequentially stacked, each of the first and second adiabatic patterns may include a two-dimensional transition metal dichalcogenide (TMDC) material, and the first leakage current pattern may include a two-dimensional TMDC material.

BRIEF DESCRIPTION OF THE DRAWINGS

Features will become apparent to those of skill in the art by describing in detail example embodiments with reference to the attached drawings in which.

DETAILED DESCRIPTION OF EMBODIMENTS

Figure 1:
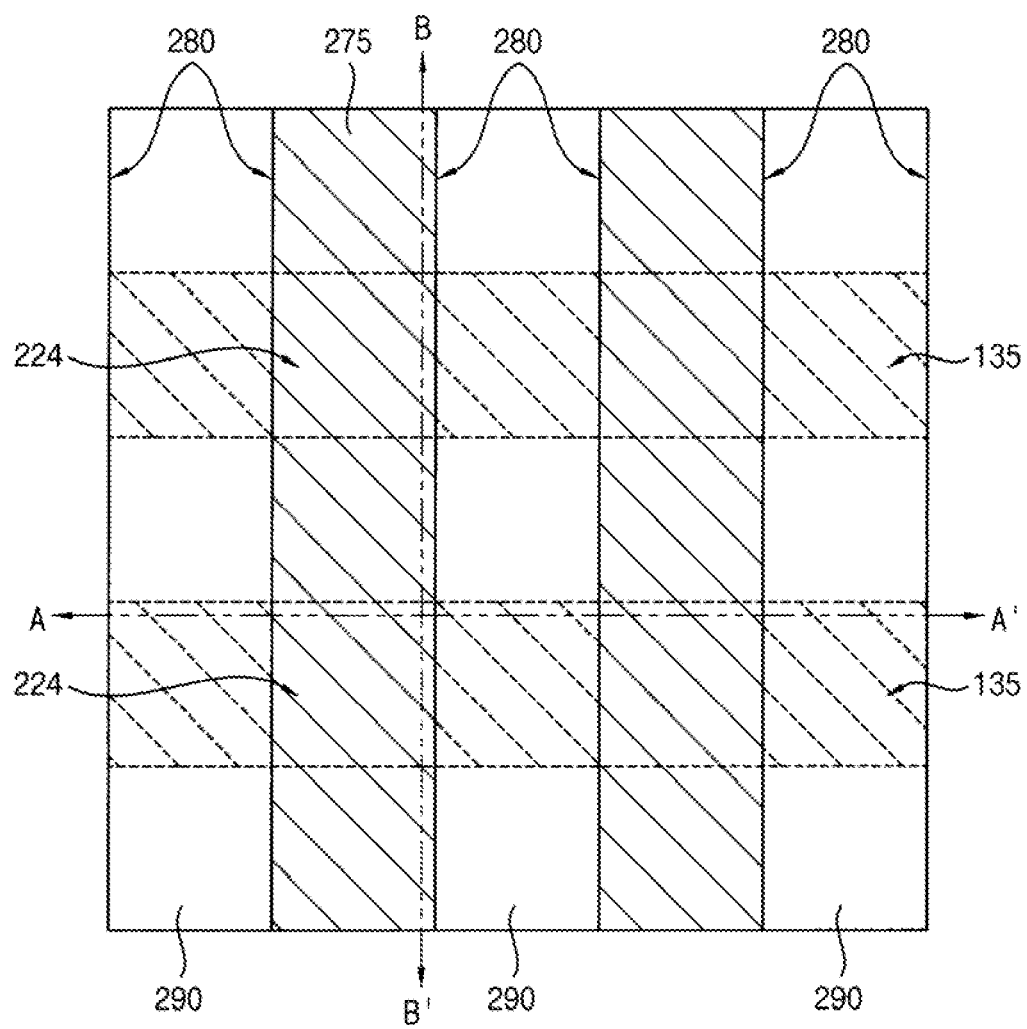
FIGS. 1 to 3 are a plan view and cross-sectional views illustrating a variable resistance memory device in accordance with example embodiments.
Figure 2:
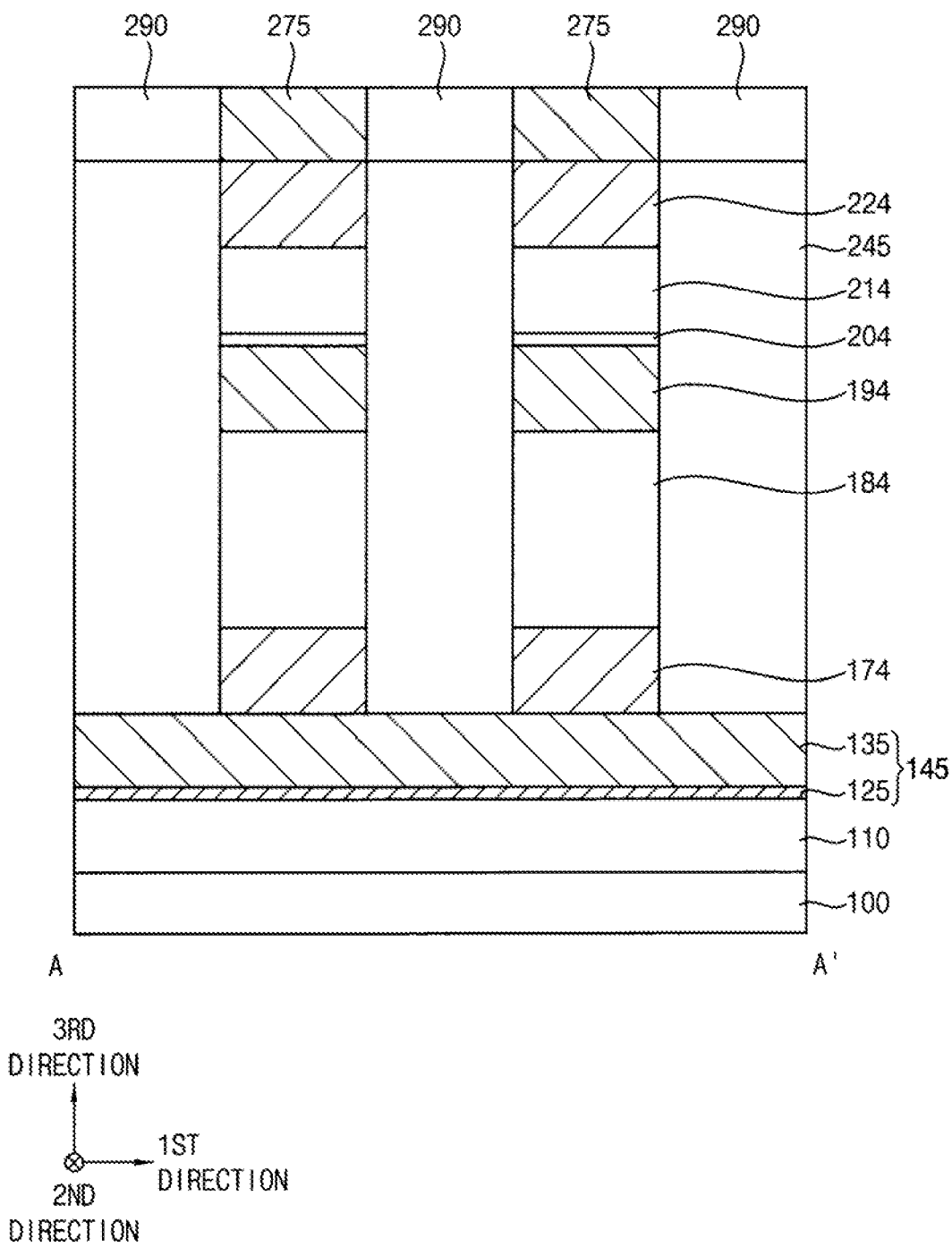
Figure 3:
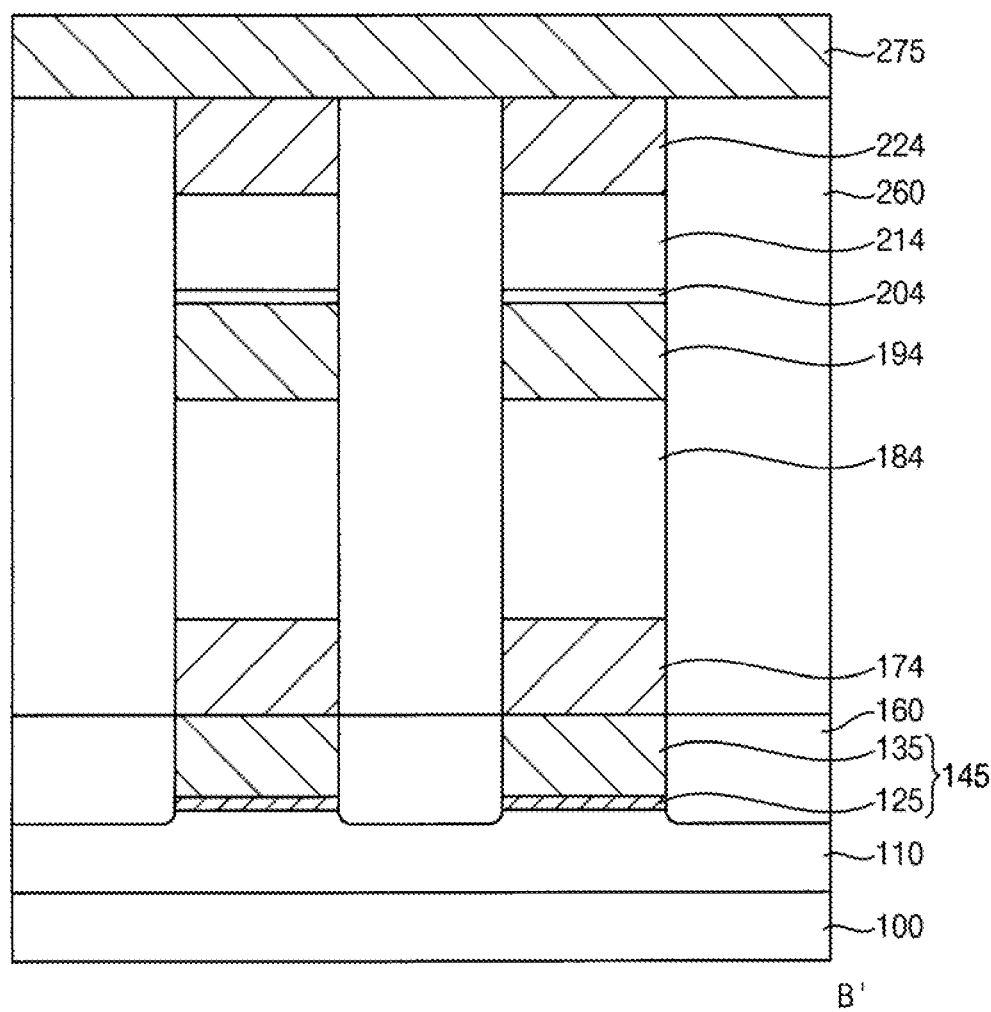
Figure 3:
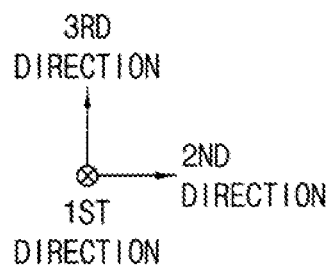

FIGS. 1 to 3 are a plan view and cross-sectional views illustrating a variable resistance memory device in accordance with example embodiments. FIG. 1 is the plan view, FIG. 2 is a cross-sectional view taken along a line A-A' of FIG. 1, and FIG. 3 is a cross-sectional view taken along a line B-B' of FIG. 1.

Referring to FIGS. 1 to 3, the variable resistance memory device may include a substrate 100 and first conductive lines 145 and second conductive lines 275 on the substrate. The first conductive lines 145 may extend in a first direction and may be spaced apart from each other in a second direction. The second conductive lines 275 may extend in the second direction and may be spaced apart from each other in the first direction. In the present example embodiment, the first direction and second directions may be considered to be horizontal directions that are parallel to an upper surface of the substrate 100. The first and second directions may be orthogonal to each other.

The variable resistance memory device may also include a first electrode 174, a variable resistance pattern 184, a second electrode 194, a selection pattern structure (which may include a first leakage current prevention pattern 204 and a selection pattern 214 sequentially stacked), and a third electrode 224 sequentially stacked in a third direction between the first and second conductive lines 145 and 275. In the present example embodiment, the third direction may be considered to be a vertical direction that is substantially perpendicular to the upper surface of the substrate 100.

The substrate 100 may include semiconductor materials, e.g., silicon, germanium, silicon-germanium, etc., or III-V compounds e.g., GaP, GaAs, GaSb, etc. In an example embodiment, the substrate 100 may be a silicon-on-insulator (SOI) substrate or a germanium-on-insulator (GOI) substrate.

Various other elements, e.g., a gate structure, a source/drain layer, a contact plug, a via, a wiring, etc., may be formed on the substrate 100, and may be covered by a first insulating interlayer 110. The first insulating interlayer 110 may include an oxide, e.g., a silicon oxide.

The first conductive line 145 may include a first barrier line 125 and a first metal line 135 sequentially stacked. The first barrier line 125 may include a metal silicide, e.g., tungsten silicide, tantalum silicide, molybdenum silicide, titanium silicide, nickel silicide, etc., a metal nitride, e.g., titanium nitride, tungsten nitride, tantalum nitride, etc., or a metal silicon nitride, e.g., titanium silicon nitride, tungsten silicon nitride, tantalum silicon nitride, etc. The first metal line 135 may include a metal, e.g., tungsten (W), platinum (Pt), copper (Cu), aluminum (Al), titanium (Ti), tantalum (Ta), ruthenium (Ru), etc. In an example embodiment, the first metal line 135 may include a cobalt-manganese compound.

The second conductive line 275 may include a material substantially the same as or similar to that of the first metal line 135 of the first conductive line 145. In the drawings, the second conductive line 275 is a single layer, although the second conductive line 275 may include, e.g., a second barrier line and a second metal line sequentially stacked, like the first conductive line 145.

The first and second conductive lines 145 and 275 may serve as a word line and a bit line, respectively, of the variable resistance memory device. In another implementation, the first and second conductive lines 145 and 275 may serve as a bit line and a word line, respectively, of the variable resistance memory device.

In an example embodiment, the first electrode 174 may include a carbon compound, e.g., conductive carbon, graphite, graphene, carbonitride, tungsten carbonitride, carbon doped with tungsten, carbon doped with molybdenum, etc. In another implementation, the first electrode 174 may include a metal, e.g., tungsten, molybdenum, tantalum, titanium, scandium, nickel, vanadium, niobium, chromium, zirconium, hafnium, etc., a metal nitride, e.g., titanium nitride, tungsten nitride, tantalum nitride, etc., or a metal silicon nitride, e.g., titanium silicon nitride. The first electrode 174 may be referred to as a lower electrode of the variable resistance memory device, and may have a multi-layered structure of more than one layer.

The variable resistance pattern 184 may include a phase change material, i.e., a material exhibiting different electrical resistances according to the phase thereof. In an example embodiment, the variable resistance pattern 184 may include a chalcogenide-based material in which germanium (Ge), antimony (Sb) and/or tellurium (Te) are combined in a predetermined ratio. In an example embodiment, the variable resistance pattern 184 may include a super lattice in which germanium-tellurium (GeTe) and antimony-tellurium (SbTe) are repeatedly stacked. In an example embodiment, the variable resistance pattern 184 may include IST containing indium-antimony-tellurium, or BST containing bismuth-antimony-tellurium. The variable resistance pattern 184 may further include, e.g., carbon (C), nitride (N), boron (B), oxygen (O), etc. In an example embodiment, the variable resistance pattern 184 may include a perovskite-based material or a transition metal oxide. The perovskite-based material may include, e.g., STO ($SrTiO_3$), BTO ($BaTiO_3$), PCMO ($Pr_{1-x}Ca_xMnO_3$), etc. The transition metal oxide may include, e.g., titanium oxide ($TiO_x$), zirconium oxide ($ZrO_x$), aluminum oxide ($AlO_x$), hafnium oxide ($HfO_x$), etc. These may be used alone or in a combination thereof.

The second and third electrodes 194 and 224 may include substantially the same material as the first electrode 174, e.g., a carbon compound, e.g., conductive carbon, graphite, graphene, carbonitride, tungsten carbonitride, carbon doped with tungsten, carbon doped with molybdenum. In another implementation, the second and third electrodes 194 and 224 may include a metal, e.g., tungsten, molybdenum, tantalum, titanium, scandium, nickel, vanadium, niobium, chromium, zirconium, hafnium, etc., a metal nitride, e.g., titanium nitride, tungsten nitride, tantalum nitride, etc., or a metal silicon nitride, e.g., titanium silicon nitride. The second and third electrodes 194 and 224 may be referred to as a middle electrode and an upper electrode, respectively, of the variable resistance memory device, and each of the second and third electrodes 194 and 224 may have a multi-layered structure of more than one layer.

The first leakage current prevention pattern 204 of the selection pattern structure may include a transition metal dichalcogenide (TMDC) material having a two-dimensional structure. The two-dimensional structure may include a plurality of thin layers spaced apart from each other in the third direction. In an example embodiment, the TMDC material of the first leakage current prevention pattern 204 may have a structure including a plurality of monolayers having a very small thickness, e.g., less than about 0.5 nm, and the plurality of monolayers may be spaced apart from each other by a given distance, e.g., about 0.65 nm due to the Van der Waals force.

In the variable resistance memory device according to the present example embodiment, the first leakage current prevention pattern 204 may include a two-dimensional TMDC material having a low electrical conductivity, which may reduce the leakage current from the selection pattern structure.

The TMDC material may be or include a material having a chemical formula of $MX_2$ (M is a transition metal, and X is a chalcogenide). The transition metal may include at least one of molybdenum, tungsten, niobium, vanadium, tantalum, titanium, zirconium, hafnium, technetium, platinum, and rhenium, and the chalcogenide may include at least one of sulfur, selenium, and tellurium. In an example embodiment, the TMDC material may include at least one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$ and $ReSe_2$.

In an example embodiment, the TMDC material may have a multi-layered structure including layers formed of different materials from each other. In an example embodiment, the TMDC material may have a stacked structure including a first layer containing, e.g., $MoS_2$, and a second layer containing, e.g., $MoSe_2$. In this case, the first and second layers may have a reduced energy level difference, and thus the first leakage current prevention pattern 204 including the TMDC material having the stacked structure may have a reduced energy band gap.

In another implementation, the TMDC material may have a stacked structure including a third layer containing, e.g., $WSe_2$, and a fourth layer containing, e.g., $MoS_2$. In this case, the third and fourth layers may have n-type conductivity and p-type conductivity, respectively, and thus the first leakage current prevention pattern 204 including the TMDC material having the stacked structure may have a P-N junction structure. The TMDC material may have a various types of P-N junction structures, e.g., $WS_2$—$MoSe_2$, $WSe_2$—$MoSe_2$, etc.

The selection pattern 214 may include an OTS (ovonic threshold switch) material, which may serve as a switching function due to a resistance difference depending on an applied voltage while maintaining an amorphous state.

The OTS material may include, e.g., germanium (Ge), silicon (Si), arsenic (As) and/or tellurium (Te), and may further include selenium (Se), sulfur (S), carbon (C), nitrogen (N), indium (In), boron (B), etc.

The OTS material may include, e.g., AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}GenS_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

The TMDC materials of the first leakage current prevention pattern 204 may have different energy band structures and different electrical and/or optical characteristics, and the first leakage current prevention pattern 204 may have n-type conductivity or p-type conductivity. In an example embodiment, if the first leakage current prevention pattern 204 includes $MoS_2$, it may have n-type conductivity, and the OTS material of the selection pattern 214 may have p-type conductivity, so that the first leakage current prevention pattern 204 and the selection pattern 214 may form a P-N junction, and leakage currents generated from the selection pattern 214 may be reduced. In another implementation, if the first leakage current prevention pattern 204 includes $WSe_2$, it may have p-type conductivity, and the selection pattern 214 may have n-type conductivity.

As described above, the variable resistance memory device may include the selection pattern structure having the first leakage current prevention pattern 204 containing the two-dimensional TMDC material, and may include the selection pattern 214 on the first leakage current prevention pattern 204. The TMDC material of the first leakage current prevention pattern 204 may have a stacked structure including a plurality of thin layers, which may be spaced apart from each other by a given distance, and thus the leakage currents generated from the selection pattern structure may be reduced. If the first leakage current prevention pattern 204 and the selection pattern 214 form a P-N junction, the leakage currents from the selection pattern 214 may be further reduced.

The first insulating interlayer 110 may be formed on the substrate 100, and the first conductive line 145 and a second insulating interlayer line 160 may be formed on the first insulating interlayer 110. The second insulating interlayer line 160 may be formed between ones of the first conductive lines 145 neighboring in the second direction, and may extend in the first direction.

A plurality of third insulating interlayer patterns 245 may be spaced apart from each other in the first direction on the first conductive line 145, and may opposite sidewalls in the first direction of each of the first electrode 174, the variable resistance pattern 184, the second electrode 194, the selection pattern structure, and the third electrode 224.

A fourth insulating interlayer line 260 may extend in the first direction on the second insulating interlayer line 160, and may cover opposite sidewalls in the second direction of each of the first electrode 174, the variable resistance pattern 184, the second electrode 194, the selection pattern structure, the third electrode 224, and the third insulating interlayer pattern 245. A fifth insulating interlayer line 290 may extend in the second direction on the third insulating interlayer pattern 245 and the fourth insulating interlayer line 260, and may cover opposite sidewall in the first direction of the second conductive line 275.

The first insulating interlayer 110, the second insulating interlayer line 160, the third insulating interlayer pattern 245, the fourth insulating interlayer line 260, and the fifth insulating interlayer line 290 may include an insulating material. The insulating material may include, e.g., a nitride such as silicon nitride or an oxide such as silicon oxide. In another implementation, the insulating material may include, e.g., oxycarbide such as silicon oxycarbide or oxynitride such as silicon oxynitride.

FIGS. 4 to 18 are plan views and cross-sectional views illustrating a method of manufacturing a variable resistance memory device in accordance with example embodiments. FIGS. 4, 9, 12 and 16 are plan views, FIGS. 5, 7, 10, 13, 14 and 17 are cross-sectional views taken along lines A-A' of corresponding plan views, respectively, and FIGS. 6, 8, 11, 15 and 18 are cross-sectional views taken along lines B-B' of corresponding plan views, respectively.

Figure 4:
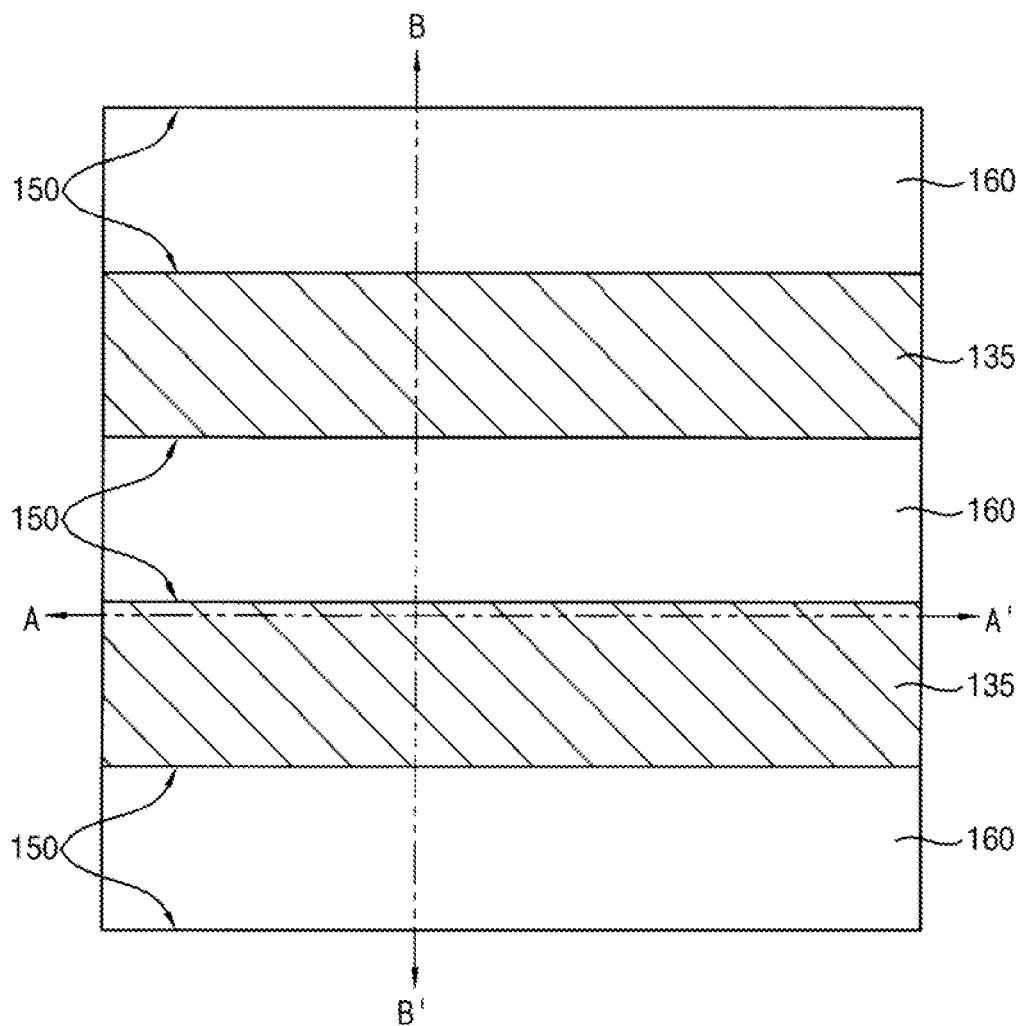
FIGS. 4 to 18 are plan views and cross-sectional views illustrating a method of manufacturing a variable resistance memory device in accordance with example embodiments.
Figure 4:
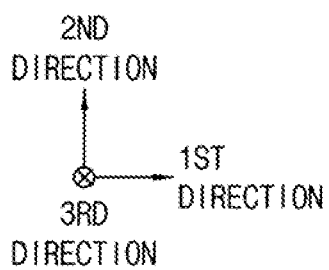
Figure 5:
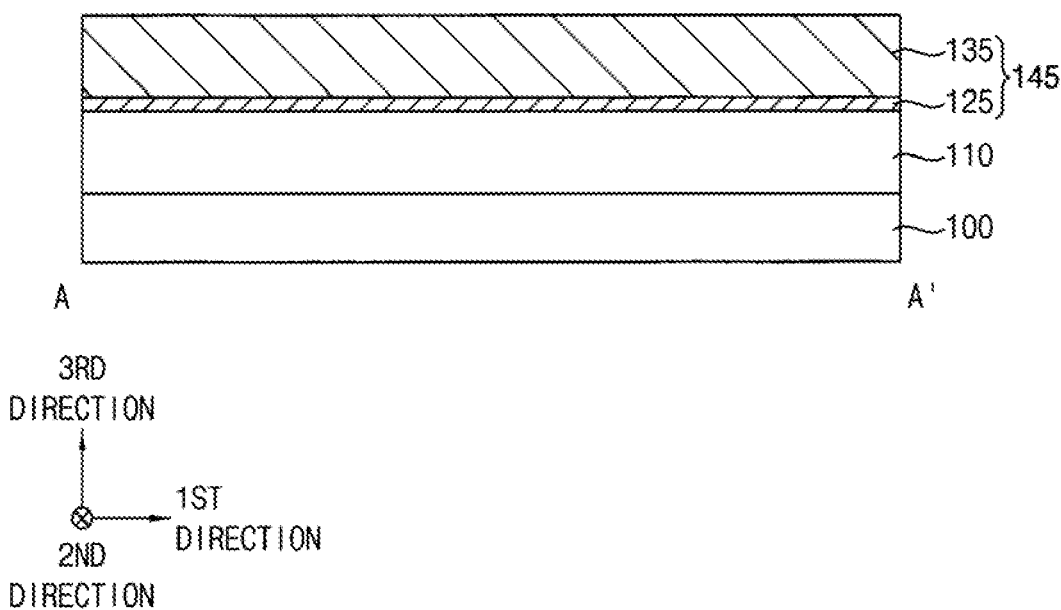
Figure 6:
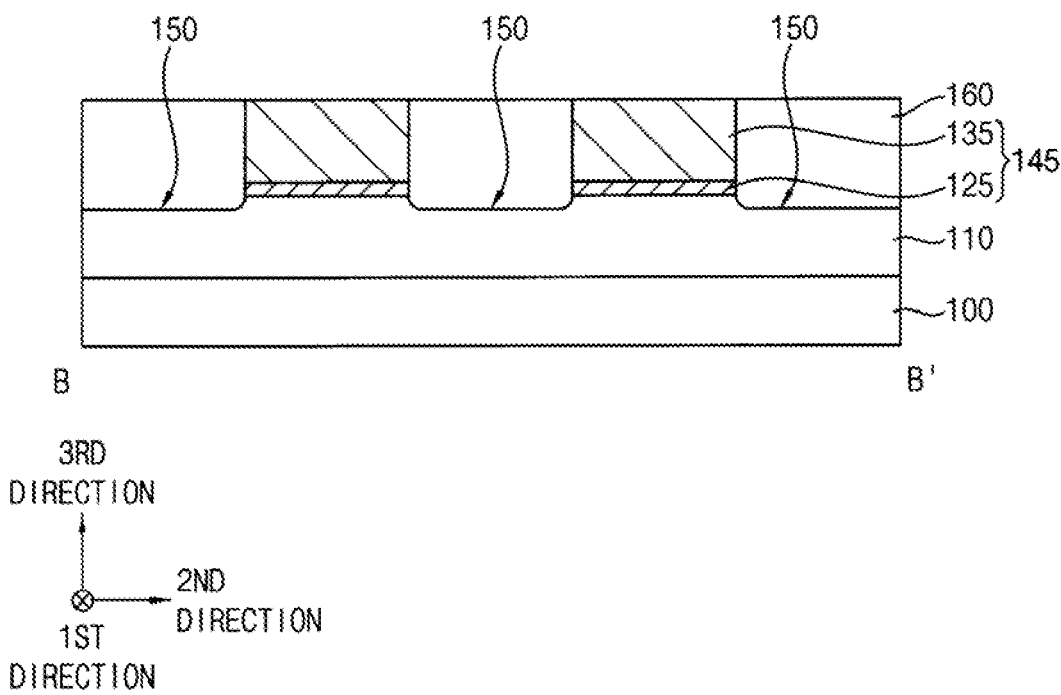

Referring to FIGS. 4 to 6, a first insulating interlayer 110 may be formed on a substrate 100, and a first conductive line 145 including a first barrier line 125 and a first metal line 135 sequentially stacked may be formed on the first insulating interlayer 110.

The first conductive line 145 may be formed by sequentially forming a first barrier layer and a first metal layer on the first insulating interlayer 110, forming a first etching mask on the first metal layer, and sequentially etching the first barrier layer and the first metal layer using the first etching mask.

In an example embodiment, the first etching mask may extend in the first direction, and thus each of the first barrier line 125 and the first metal line 135 may extend in the first direction. The first etching mask may be formed by, e.g., a double patterning process.

The first conductive line 145 may extend in the first direction, and a plurality of first conductive lines 145 may be formed to be spaced apart from each other in the second direction. A first opening 150 may be formed to expose an upper surface of the first insulating interlayer 110 between ones of the first conductive lines 145 neighboring in the second direction.

A second insulating interlayer line 160 may be formed to fill the first opening 150.

For example, a second insulating interlayer may be formed on the first insulating interlayer 110 to fill the first opening 150 and cover the first conductive lines 145, and may be planarized until upper surfaces of the first conductive lines 145 are exposed. Thus, the second insulating interlayer line 160 may extend in the first direction, and a plurality of second insulating interlayer lines 160 may be formed to be spaced apart from each other in the second direction.

The planarization process may include a chemical mechanical polishing (CMP) process and/or an etch back process. During the planarization process, the first etching mask on the first conductive line 145 may be removed.

Figure 7:
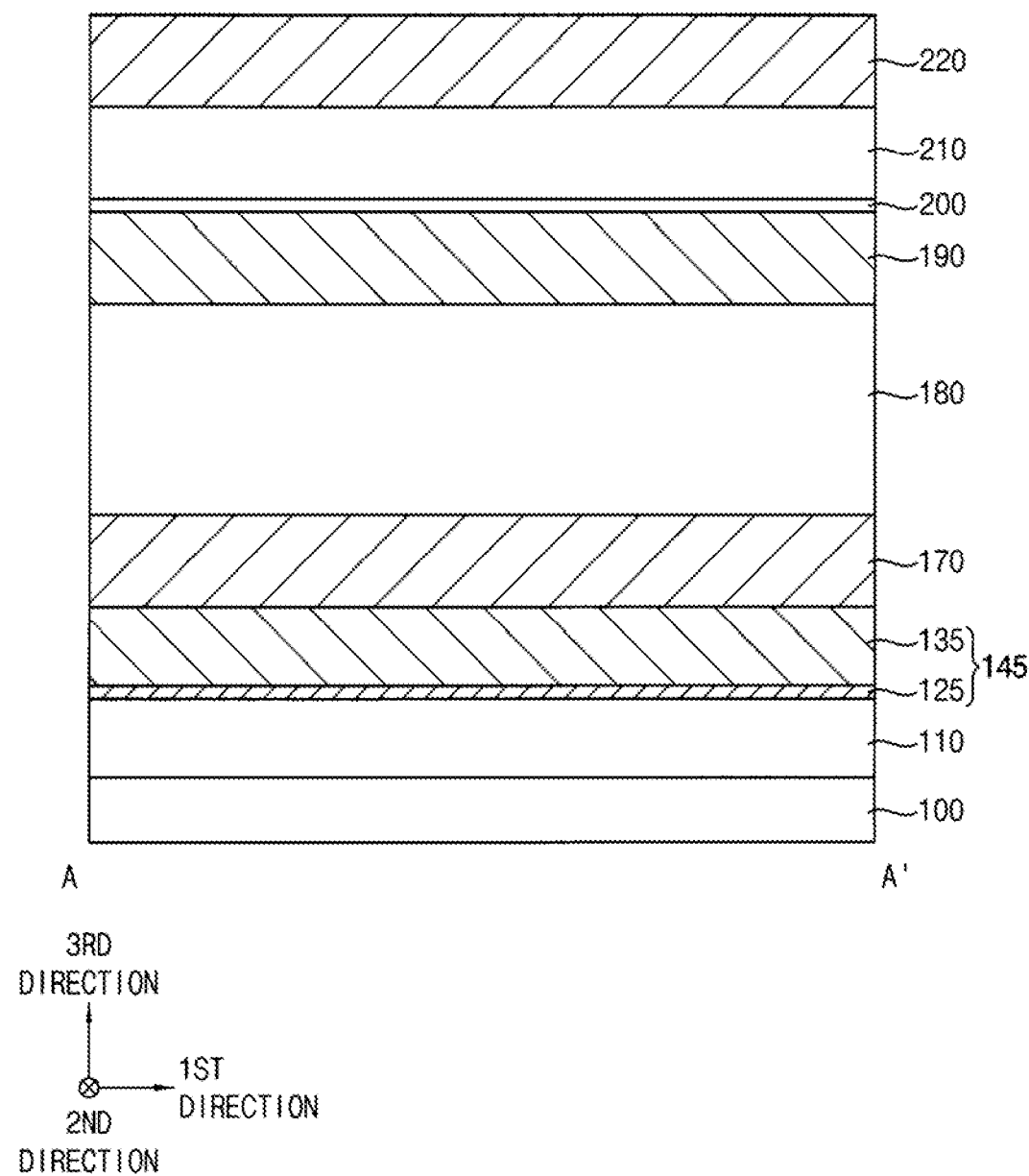
Figure 8:
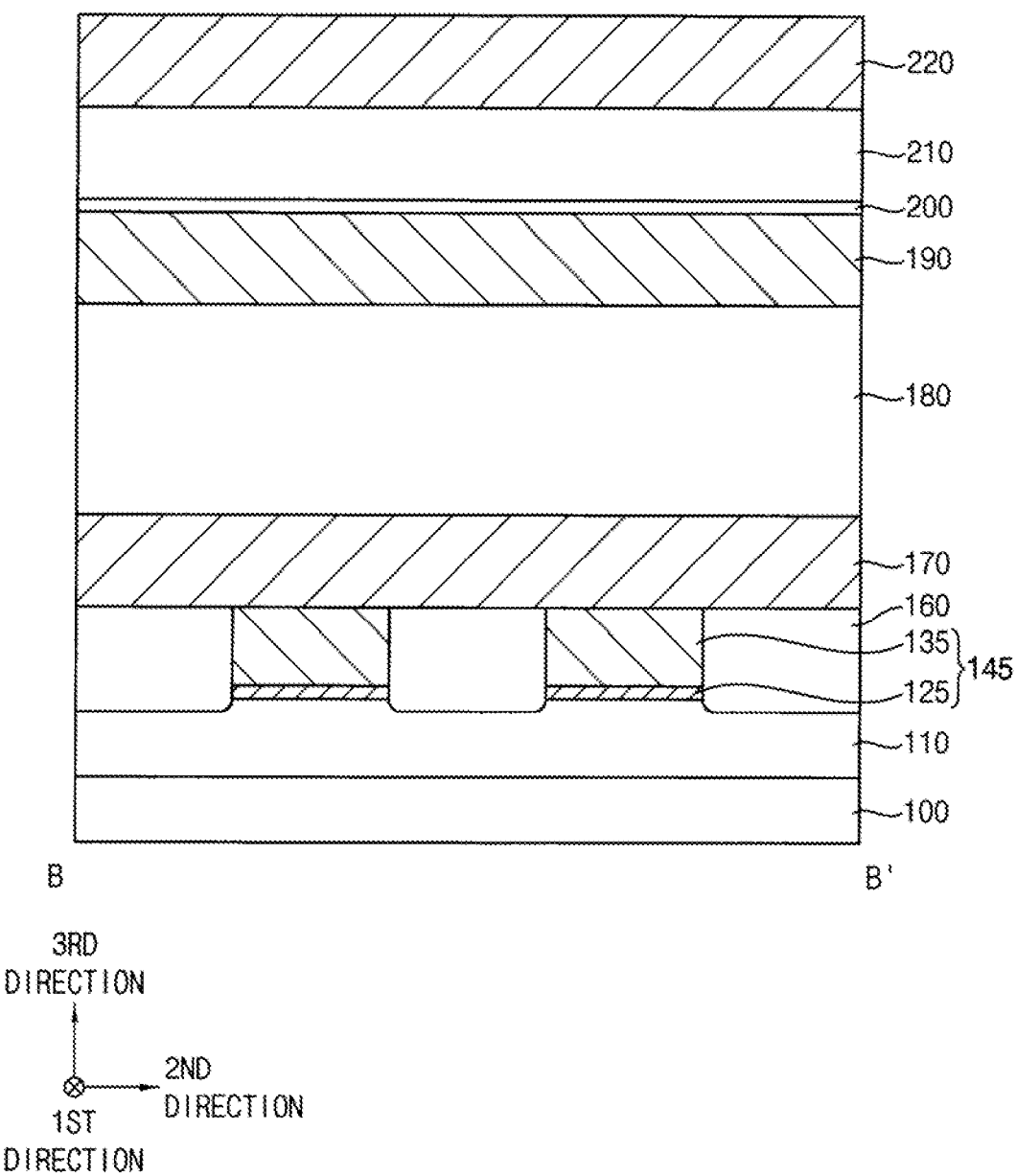

Referring to FIGS. 7 and 8, a first electrode layer 170, a variable resistance layer 180, a second electrode layer 190, a first leakage current prevention layer 200, a selection layer 210, and a third electrode layer 220 may be sequentially stacked on the first conductive line 145 and the second insulating interlayer line 160.

The first electrode layer 170, the variable resistance layer 180, the second electrode layer 190, the first leakage current prevention layer 200, the selection layer 210, and the third electrode layer 220 sequentially stacked on the first conductive line 145 and the second insulating interlayer line 160 may be formed by, e.g., a physical vapor deposition (PVD) process, a molecular beam epitaxy (MBE) deposition process, an atomic layer deposition (ALD) process, a chemical vapor deposition (CVD) process, a plasma-enhanced CVD (PECVD) process, etc.

Figure 9:
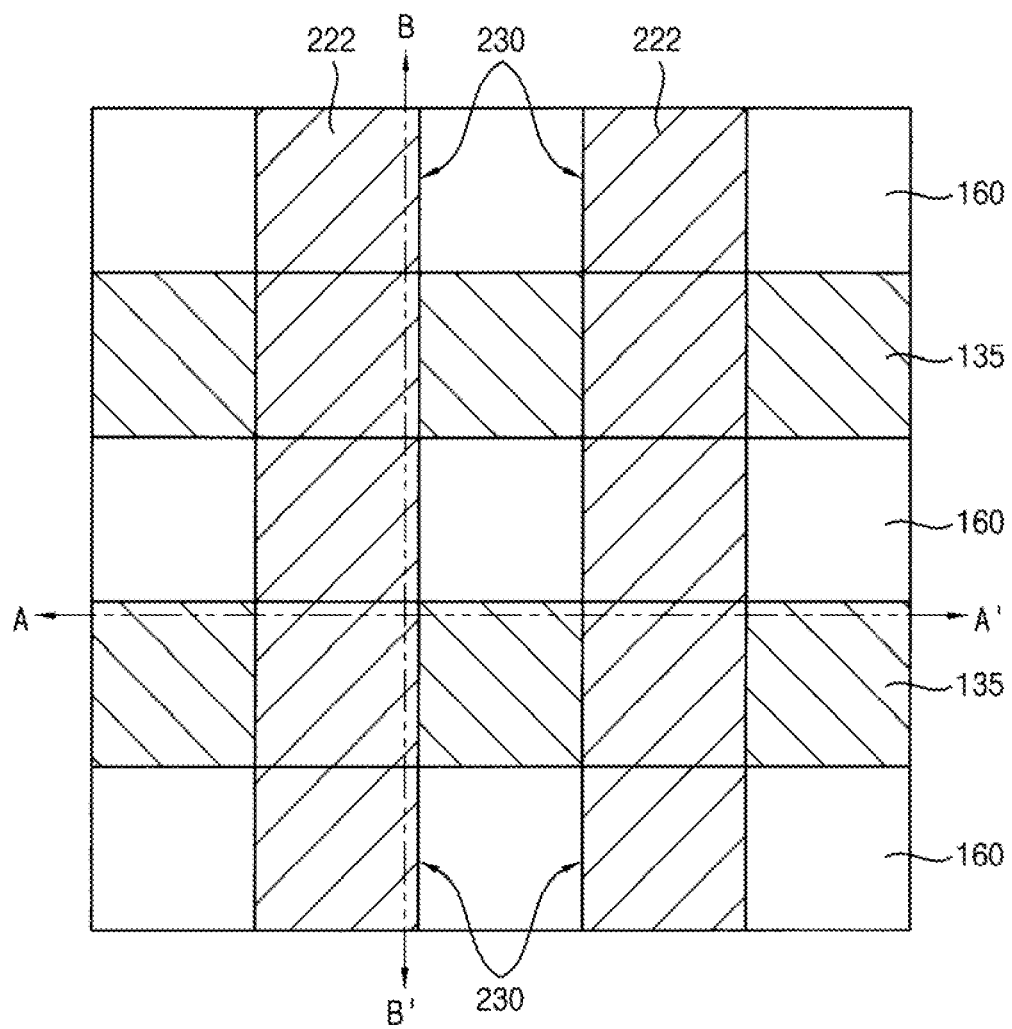
Figure 10:
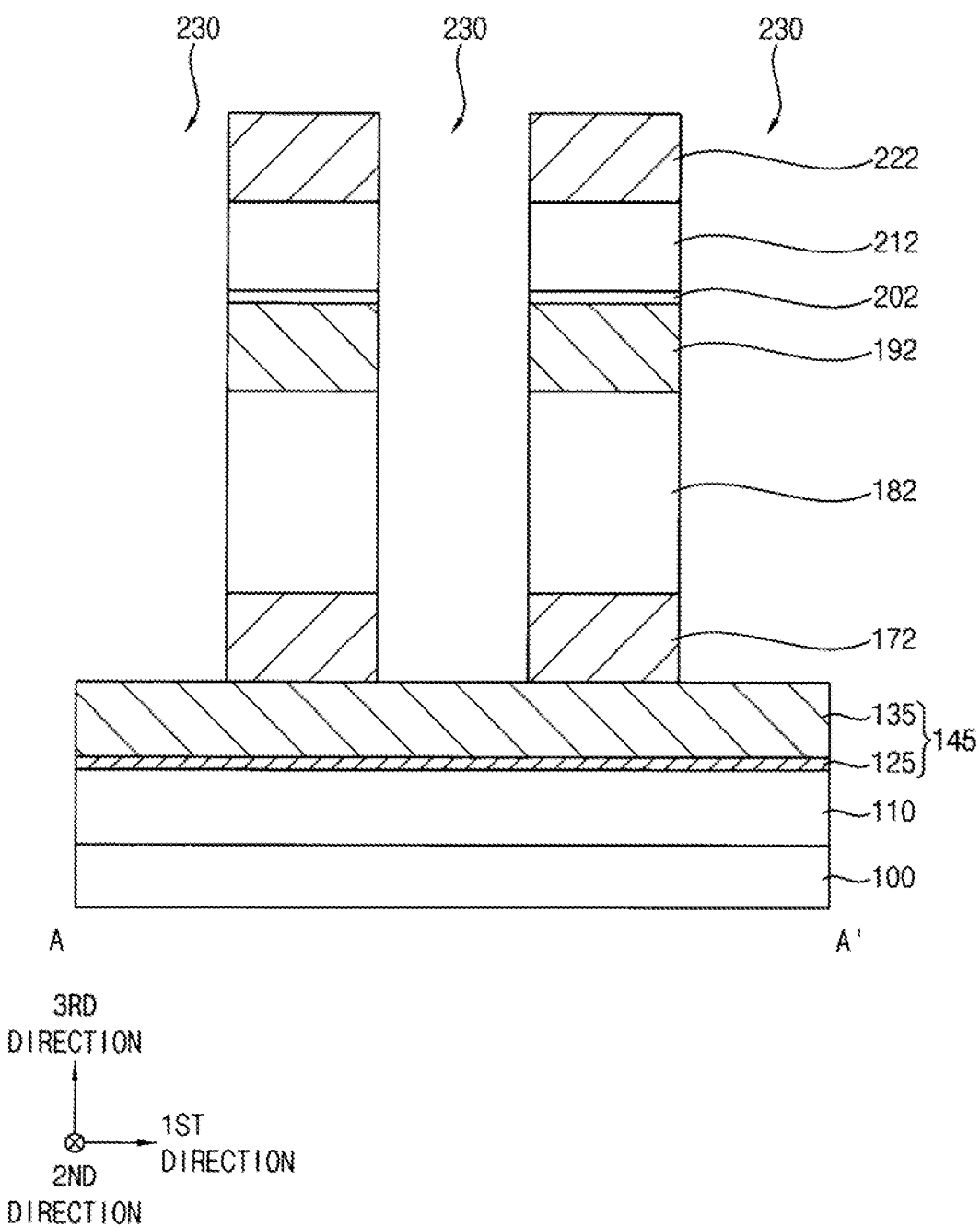
Figure 11:
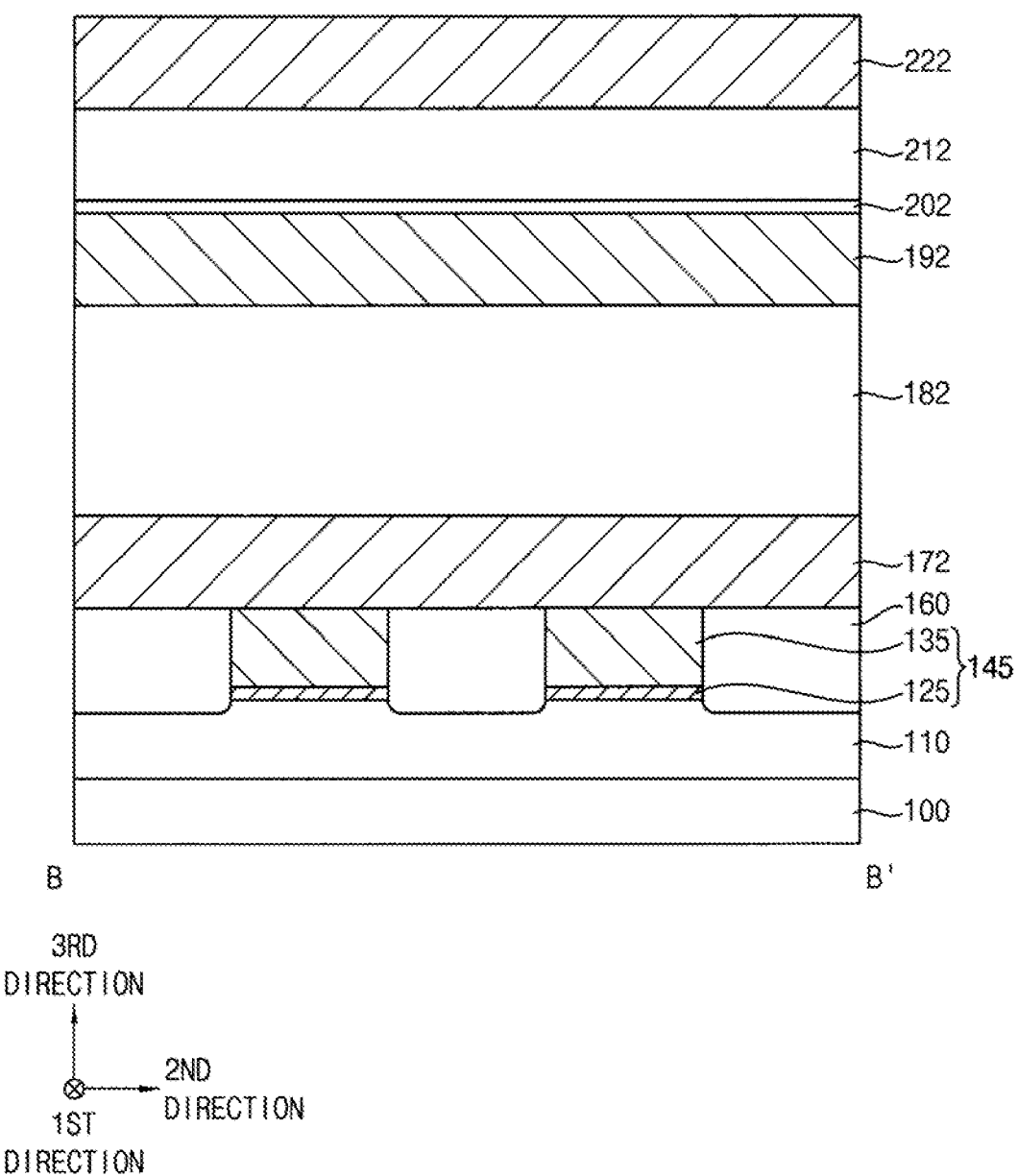

Referring to FIGS. 9 to 11, a line structure including a first electrode line 172, a variable resistance line 182, a second electrode line 192, a first leakage current prevention line 202, a selection line 212 and a third electrode line 222 sequentially stacked may be formed on the first conductive line 145 and the second insulating interlayer line 160.

The line structure may be formed by forming a second etching mask on the third electrode layer 220, and sequentially etching the first electrode layer 170, the variable resistance layer 180, the second electrode layer 190, the first leakage current prevention layer 200, the selection layer 210, and the third electrode layer 220 using the second etching mask.

The line structure may extend in the second direction, and a plurality of line structures may be formed to be spaced apart from each other in the first direction. A second opening 230 may be formed to expose upper surfaces of the first metal line 135 and the second insulating interlayer line 160 between ones of the line structures neighboring in the first direction.

Figure 12:
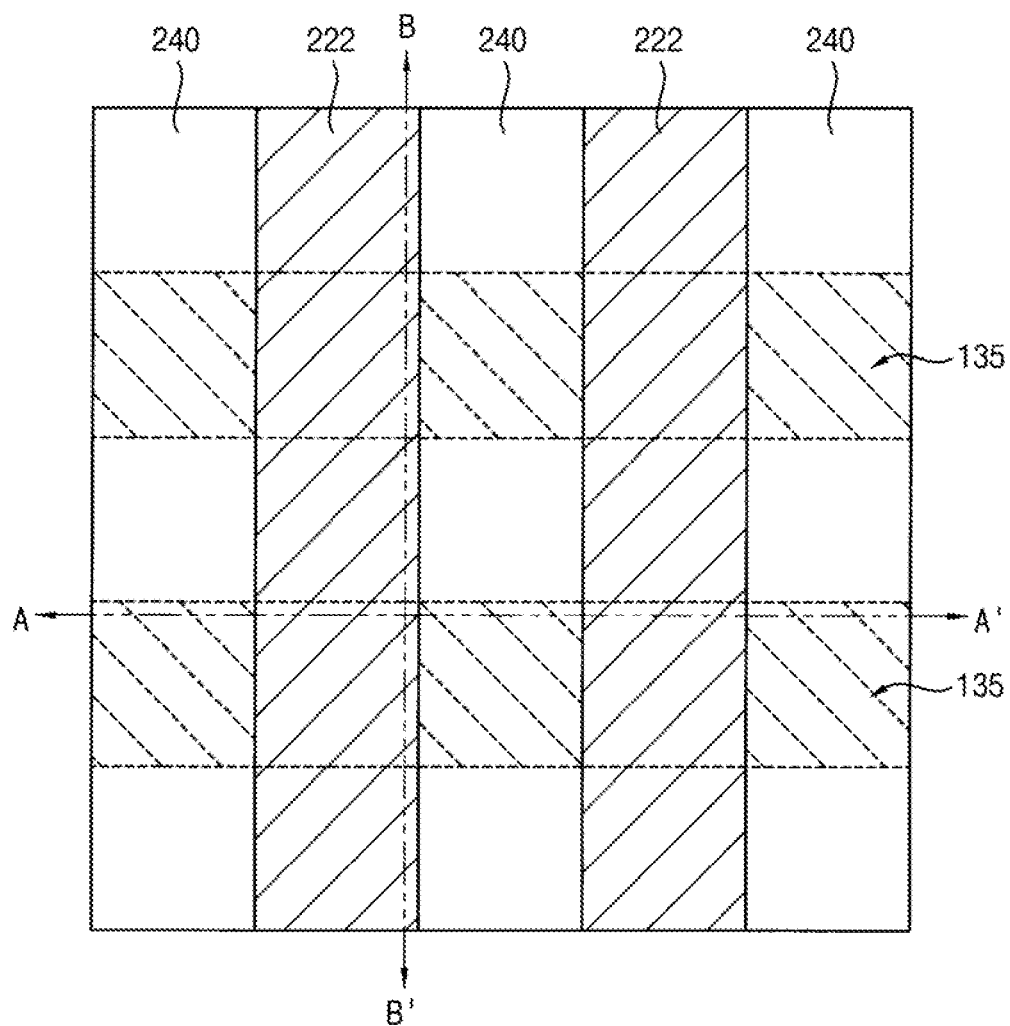
Figure 13:
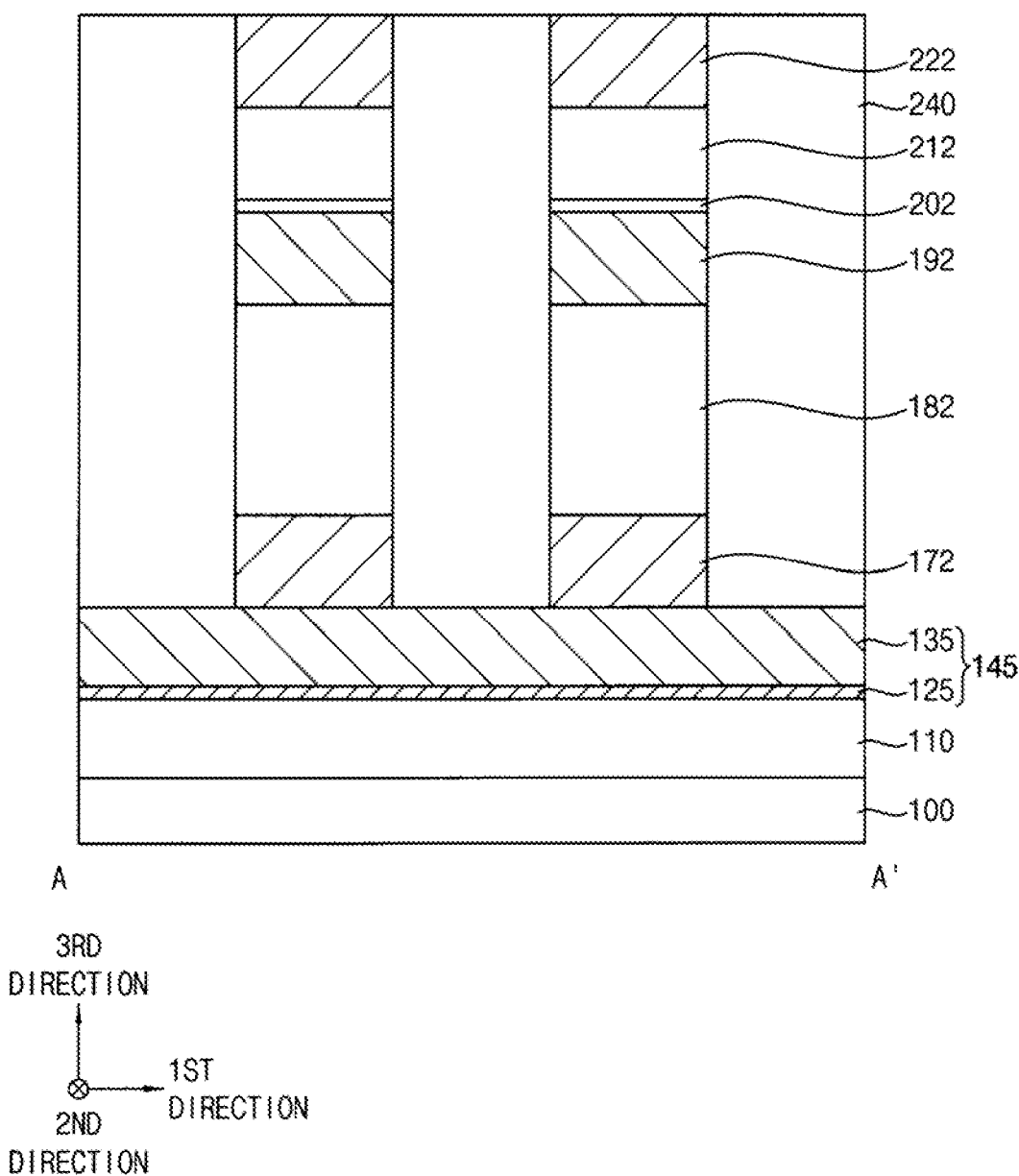

Referring to FIGS. 12 and 13, a third insulating interlayer line 240 may be formed to fill the second opening 230.

The third insulating interlayer line 240 may be formed by forming a third insulating interlayer on the first metal line 135 and the second insulating interlayer line 160 to fill the second opening 230 and cover the line structures, and planarizing the third insulating interlayer until upper surfaces of the line structures are exposed.

The third insulating interlayer line 240 may extend in the second direction to cover opposite sidewalls in the first direction of the line structures, and a plurality of third insulating interlayer lines 240 may be formed to be spaced apart from each other in the first direction.

The planarization process may include a CMP process and/or an etch back process. During the planarization process, the second etching mask may be removed.

Figure 14:
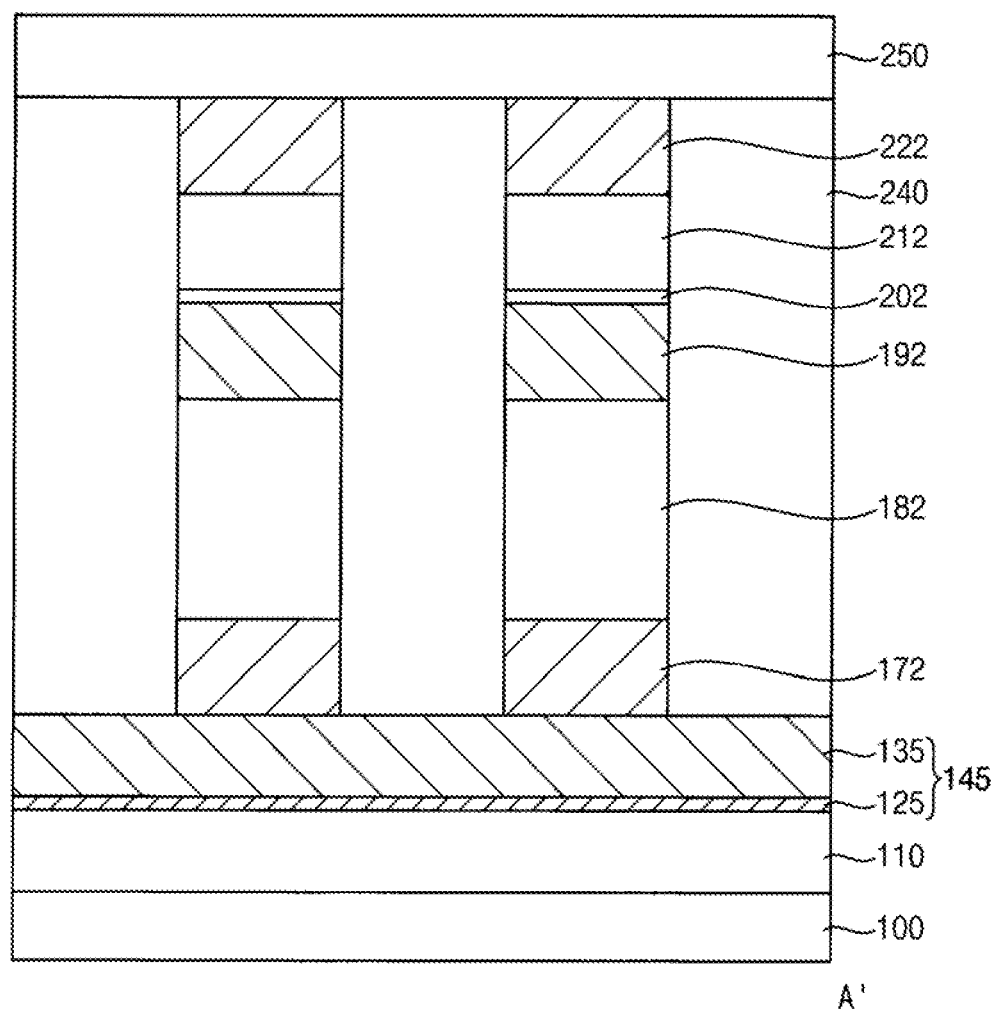
Figure 15:
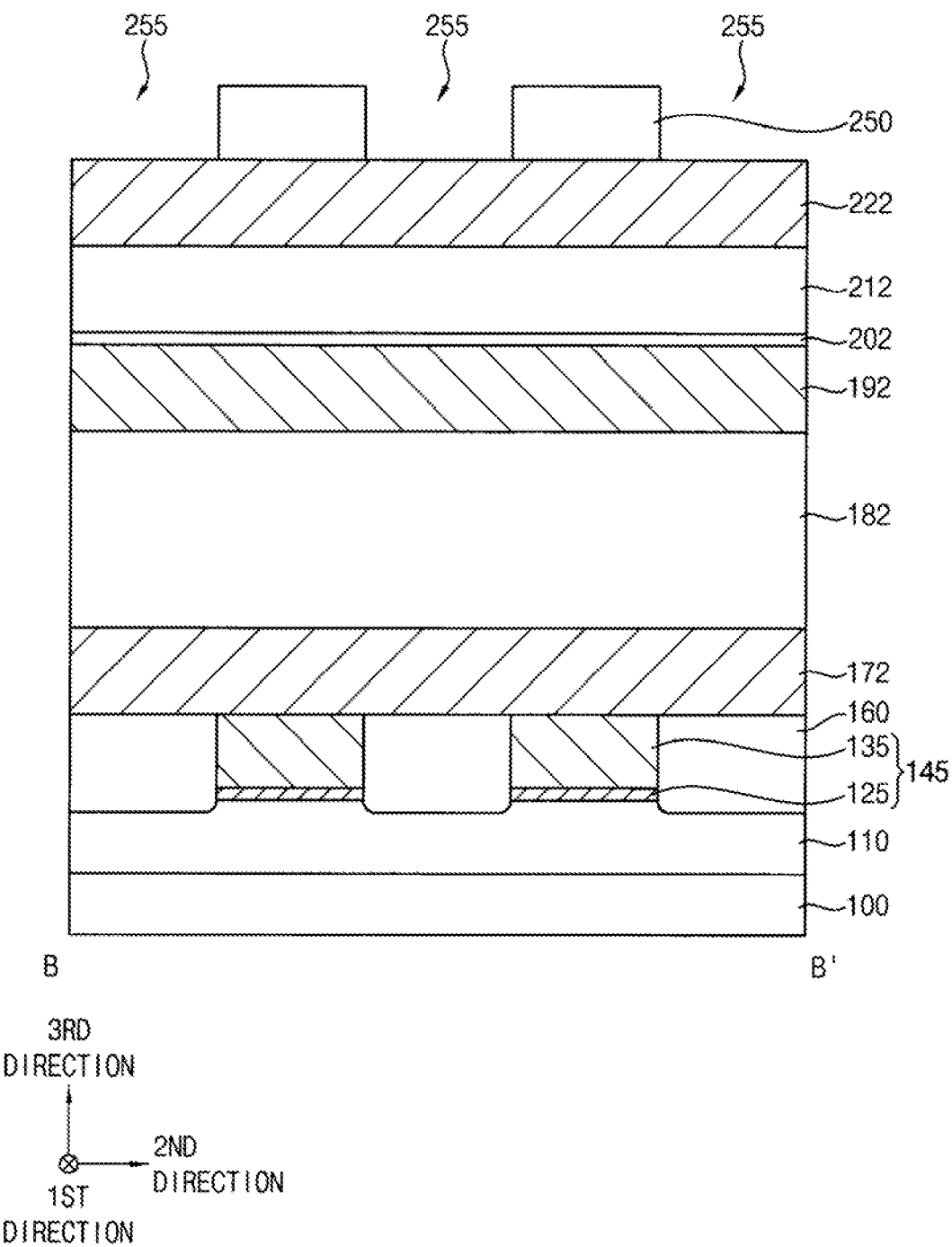

Referring to FIGS. 14 and 15, a third etching masks 250 may be formed on the line structure and the third insulating interlayer line 240.

In an example embodiment, the third etching mask may extend in the first direction, and a plurality of third etching masks may be formed to be spaced apart from each other in the second direction. A third opening 255 may be formed to expose upper surfaces of the third electrode line 222 and the third insulating interlayer line 240 between ones of the third etching masks 250 neighboring in the second direction.

In an example embodiment, the third etching mask may be aligned with the first conductive line 145 in the third direction.

Figure 16:
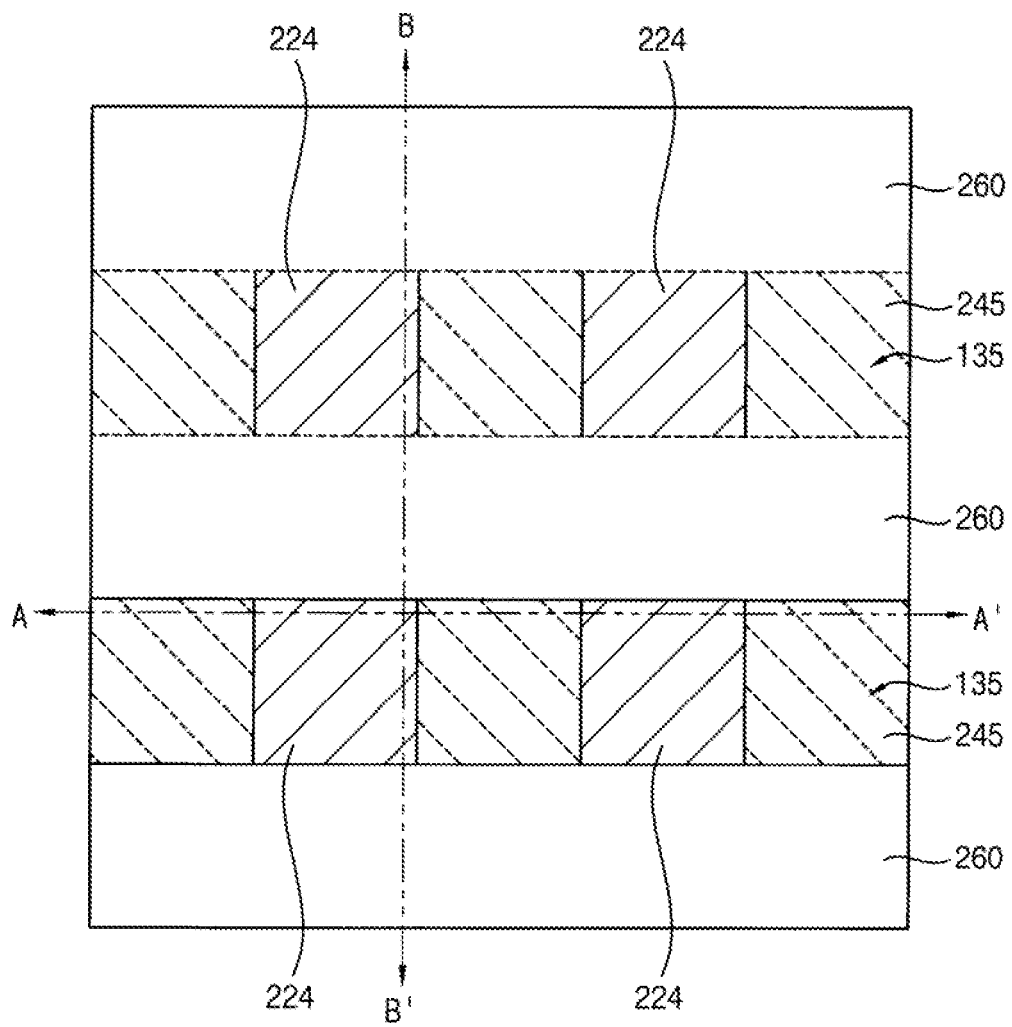
Figure 17:
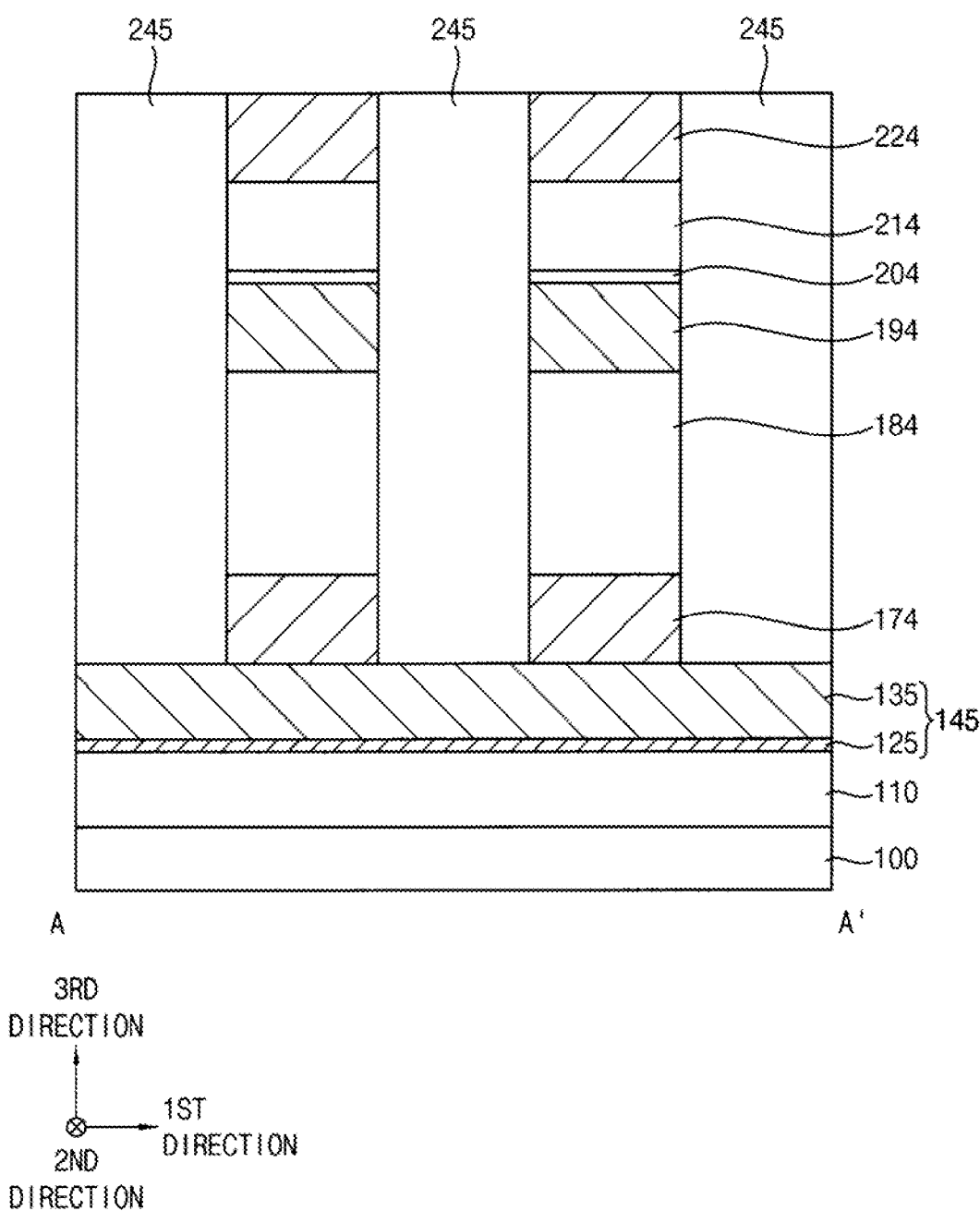
Figure 18:
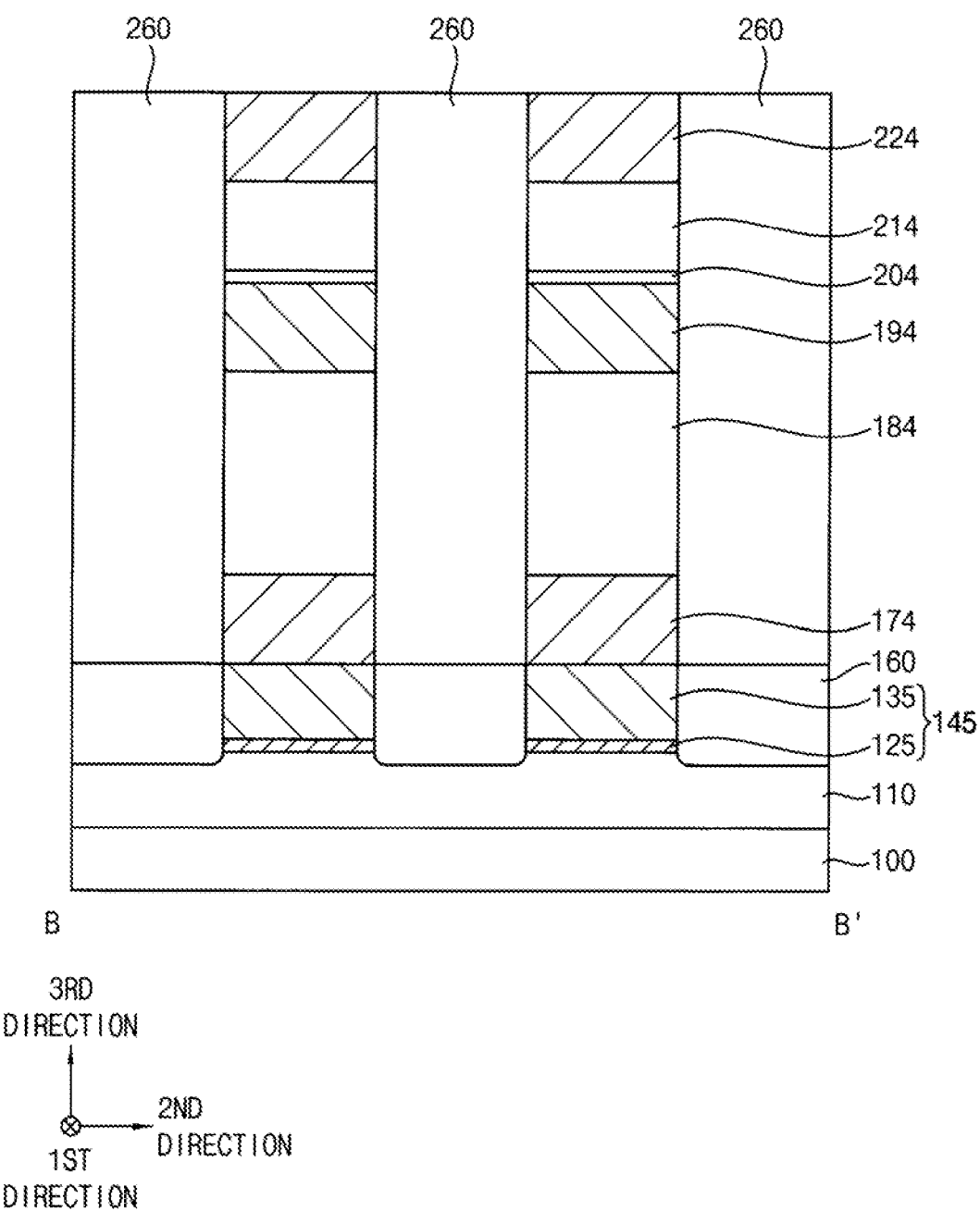

Referring to FIGS. 16 to 18, a first electrode 174, a variable resistance pattern 184, a second electrode 194, a first leakage current prevention pattern 204, a selection pattern 214 and a third electrode 224 sequentially stacked may be formed on the first conductive line 145. The first leakage current prevention pattern 204 and the selection pattern 214 may form a selection pattern structure.

For example, the first electrode 174, the variable resistance pattern 184, the second electrode 194, the first leakage current prevention pattern 204, the selection pattern 214 and the third electrode 224 may be formed by sequentially etching the first electrode line 172, the variable resistance line 182, the second electrode line 192, the first leakage current prevention line 202, the selection line 212 and the third electrode line 222.

A plurality of first electrodes 174, a plurality of variable resistance patterns 184, a plurality of second electrodes 194, a plurality of first leakage current prevention patterns 204, a plurality of selection patterns 214, and a plurality of third electrodes 224 may be formed in each of the first and second directions.

The etching process may be performed until an upper surface of the second insulating interlayer line 160 is exposed, and thus a fourth opening may be formed to expose the upper surface of the second insulating interlayer line 160 between structures including the first electrode 174, the variable resistance pattern 184, the second electrode 194, the first leakage current prevention pattern 204, the selection pattern 214 and the third electrode 224 neighboring in the first direction, and between the third insulating interlayer lines 240 neighboring in the first direction. As the fourth opening is formed, the third insulating interlayer line 240 may be transformed into a third insulating interlayer pattern 245.

A fourth insulating interlayer may be formed on the second insulating interlayer line 160 to fill the fourth opening and to cover the structures, and may be planarized to form a fourth insulating interlayer line 260. The fourth insulating interlayer line 260 may extend in the first direction, and a plurality of fourth insulating interlayer lines 260 may be formed to be spaced apart from each other in the second direction.

In an example embodiment, TMDC materials of the first leakage current prevention pattern 204 may have different energy band structures and different electrical/optical characteristics, and thus the first leakage current prevention pattern 204 may have n-type conductivity or p-type conductivity. In an example embodiment, if the first leakage current prevention pattern 204 includes $MoS_2$, it may have n-type conductivity, and an OTS material of the selection pattern 214 may have p-type conductivity, so that the first leakage current prevention pattern 204 and the selection pattern 214 may form a P-N junction, and leakage currents generated from the selection pattern 214 may be reduced. In another implementation, if the first leakage current prevention pattern 204 includes $WSe_2$, it may have p-type conductivity, and the selection pattern 214 may have n-type conductivity.

Referring to FIGS. 1 to 3 again, a second conductive line 275 may be formed on the third electrode 224 and the fourth insulating interlayer line 260.

For example, the second conductive line 275 may be formed by forming a second conductive layer on the third electrode 224, the fourth insulating interlayer line 260, and the third insulating interlayer pattern 245, forming a fourth etching mask on the second conductive layer, and etching the second conductive layer using the fourth etching mask.

In an example embodiment, the fourth etching mask may extend in the second direction, and thus the second conductive line 275 may also extend in the second direction. The fourth etching mask may be formed by, e.g., a double patterning process.

FIGS. 2 and 3 show that the second conductive line 275 is a single layer, however, the second conductive line 275 may include a second barrier line and a second metal line each of which may extend in the second direction, as the first conductive line 145.

A plurality of second conductive lines 275 may be formed to be spaced apart from each other in the first direction, and a fifth opening 280 may be formed to expose upper surfaces of the third insulating interlayer pattern 245 and the fourth insulating interlayer line 260 between ones of the second conductive lines 275 neighboring in the first direction.

A fifth insulating interlayer line 290 may be formed to fill the fifth opening 280 to complete the fabrication of the variable resistance memory device.

Up to now, etching processes have been performed twice using the second etching mask and the third etching mask 250, respectively, in order to form the first electrode 174, the variable resistance pattern 184, the second electrode 194, the first leakage current prevention pattern 204, the selection pattern 214 and the third electrode 224 sequentially stacked in each of areas where the first and second conductive lines 145 and 275 overlap each other in the third direction, respectively. In another example, the first electrode 174, the variable resistance pattern 184, the second electrode 194, the first leakage current prevention pattern 204, the selection pattern 214 and the third electrode 224 may be formed by performing an etching process using one etching mask, or performing more than two etching processes using more than two etching masks, respectively.

Figure 19:
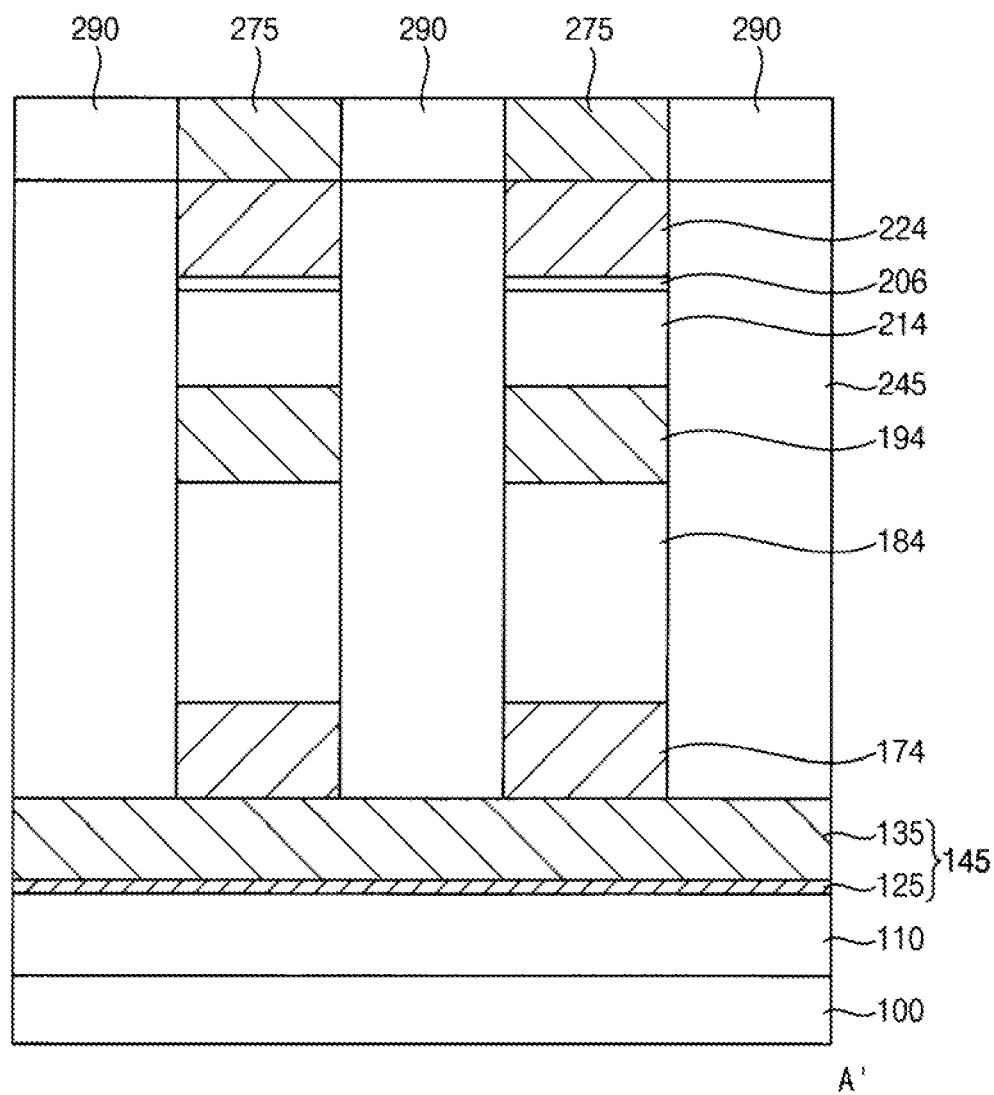
FIGS. 19 and 20 are cross-sectional views illustrating variable resistance memory devices in accordance with example embodiments.
Figure 20:
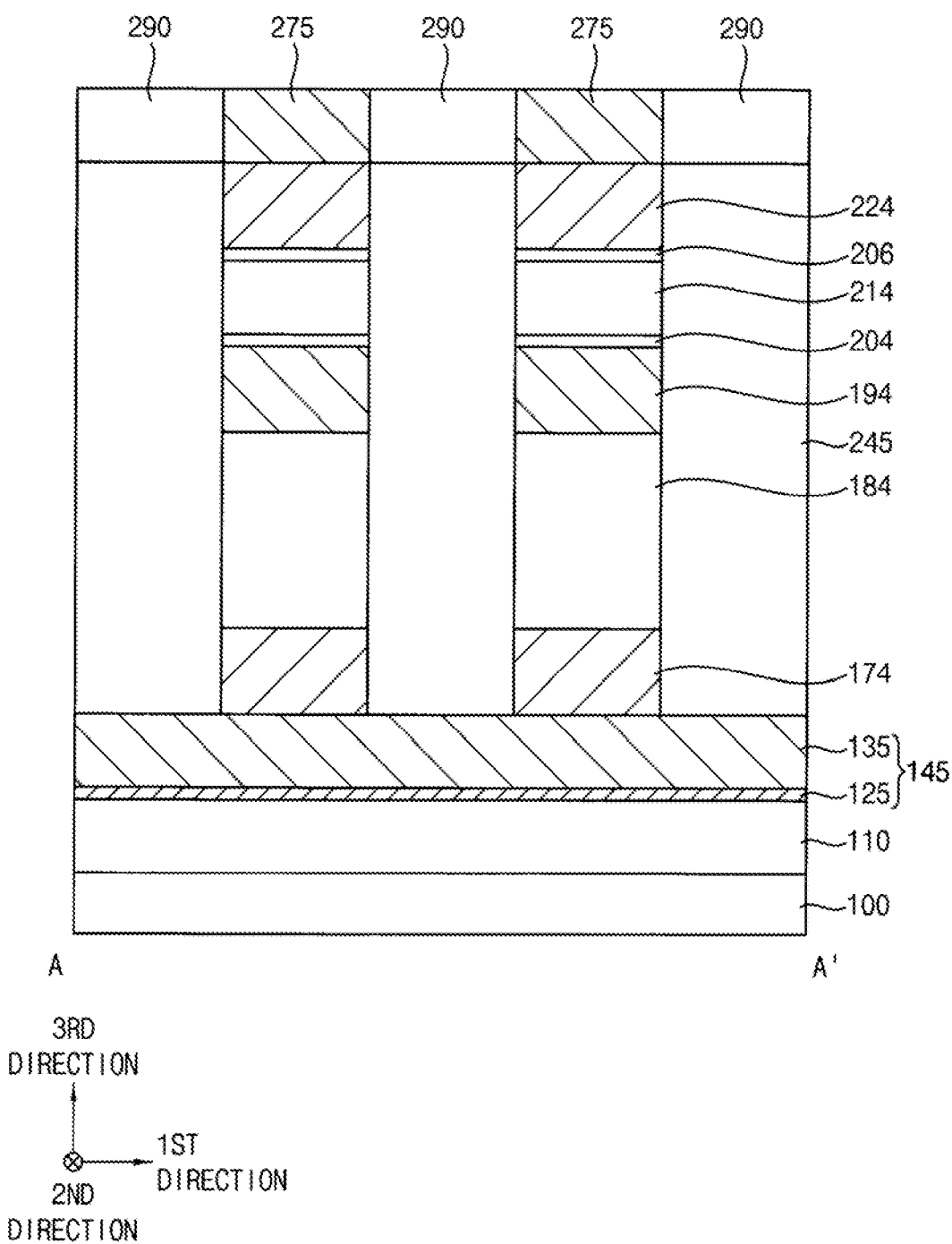

FIGS. 19 and 20 are cross-sectional views illustrating variable resistance memory devices in accordance with example embodiments. FIGS. 19 and 20 are cross-sectional views taken along the line A-A' of FIG. 1

These variable resistance memory devices may be substantially the same as or similar to that of FIGS. 1 to 3, except for the selection pattern structure. Thus, like reference numerals refer to like elements, and repeated descriptions thereof may be abbreviated or omitted.

Referring to FIG. 19, the variable resistance memory device may include the first electrode 174, the variable resistance pattern 184, the second electrode 194, the selection pattern structure, and the third electrode 224 in each of areas where the first and second conductive lines 145 and 275 overlap each other in the third direction, respectively, and the selection pattern structure may include the selection pattern 214 and a second leakage current prevention pattern 206 thereon.

The second leakage current prevention pattern 206 may include substantially the same material as the first leakage current prevention pattern 204, e.g., a two-dimensional TMDC material. The second leakage current prevention pattern 206 may have n-type conductivity or p-type conductivity, and may form a P-N junction together with the selection pattern 214 having p-type conductivity or n-type conductivity.

Referring to FIG. 20, the selection pattern structure may include the first leakage current prevention pattern 204, the selection pattern 214 and the second leakage current prevention pattern 206 sequentially stacked.

The first and second leakage current prevention patterns 204 and 206 may include substantially the same material.

In an example embodiment, the first leakage current prevention pattern 204 may have n-type conductivity or p-type conductivity, and the second leakage current prevention pattern 206 may not have conductivity. In another implementation, the second leakage current prevention pattern 206 may have n-type conductivity or p-type conductivity, and the first leakage current prevention pattern 204 may not have conductivity.

FIGS. 21 to 24 are cross-sectional views illustrating variable resistance memory devices in accordance with example embodiments. FIGS. 21 to 24 are cross-sectional views taken along the line A-A' of FIG. 1

These variable resistance memory devices may be substantially the same as or similar to that of FIGS. 1 to 3, except for the inclusion of first and second adiabatic patterns, which will now be described in detail. Like reference numerals refer to like elements, and repeated descriptions thereof may be abbreviated or omitted.

Figure 21:
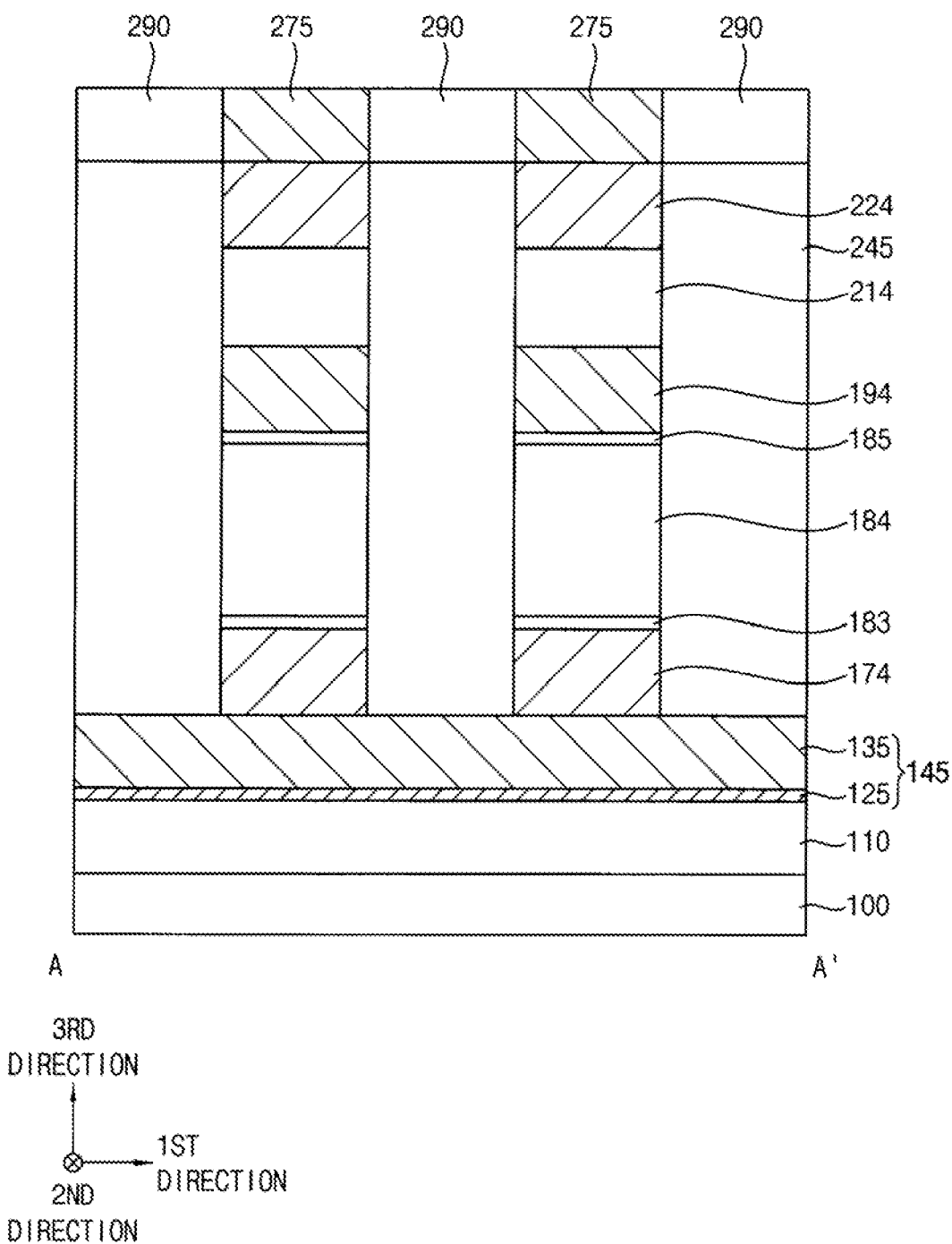
FIGS. 21 to 24 are cross-sectional views illustrating variable resistance memory devices in accordance with example embodiments.

Referring to FIG. 21, the variable resistance memory device may include a memory unit, the selection pattern 214 and the third electrode 224 in each of areas where the first and second conductive lines 145 and 275 overlap each other in the third direction, respectively, and the memory unit may include the first electrode 174, a first adiabatic pattern 183, the variable resistance pattern 184, a second adiabatic pattern 185, and the second electrode 194 sequentially stacked.

The first and second adiabatic patterns 183 and 185 may include a material substantially the same as or similar to that of the first leakage current prevention pattern 204, e.g., a two-dimensional TMDC material.

In the variable resistance memory device according to the present example embodiment, the first leakage current prevention pattern 204 may include a two-dimensional TMDC material having a low small electrical conductivity, which may reduce the leakage current from the selection pattern structure.

Additionally, the variable resistance memory device according to the present example embodiment may include the first adiabatic pattern 183 and second adiabatic pattern 185 on and under, respectively, the variable resistance pattern 184 of the memory unit, and each of the first and second adiabatic patterns 183, 185 may include a two-dimensional TMDC material having a low thermal conductivity. Accordingly, heat generated from the variable resistance pattern 184 may be limited from conducting to neighboring structures by the low thermal conductivity of the two-dimensional TMDC material.

In an example embodiment, the first electrode 174 and the first adiabatic pattern 183 under the variable resistance pattern 184 may include a carbon compound and tungsten, respectively, and the second adiabatic pattern 185 and the second electrode 194 on the variable resistance pattern 184 may include tungsten and a carbon compound, respectively.

The TMDC material of the first and second adiabatic patterns 183 and 185 may include a plurality of thin monolayers each of which may have a very thin thickness, e.g., less than about 0.5 nm, and the thin monolayers may be spaced apart from each other by, e.g., about 0.65 nm due to the Van der Waals force. Thus, each of the first and second adiabatic patterns 183 and 185 may have a low thermal conductivity, so that heat generated from the memory unit may be limited from conducting to neighboring structures.

Figure 22:
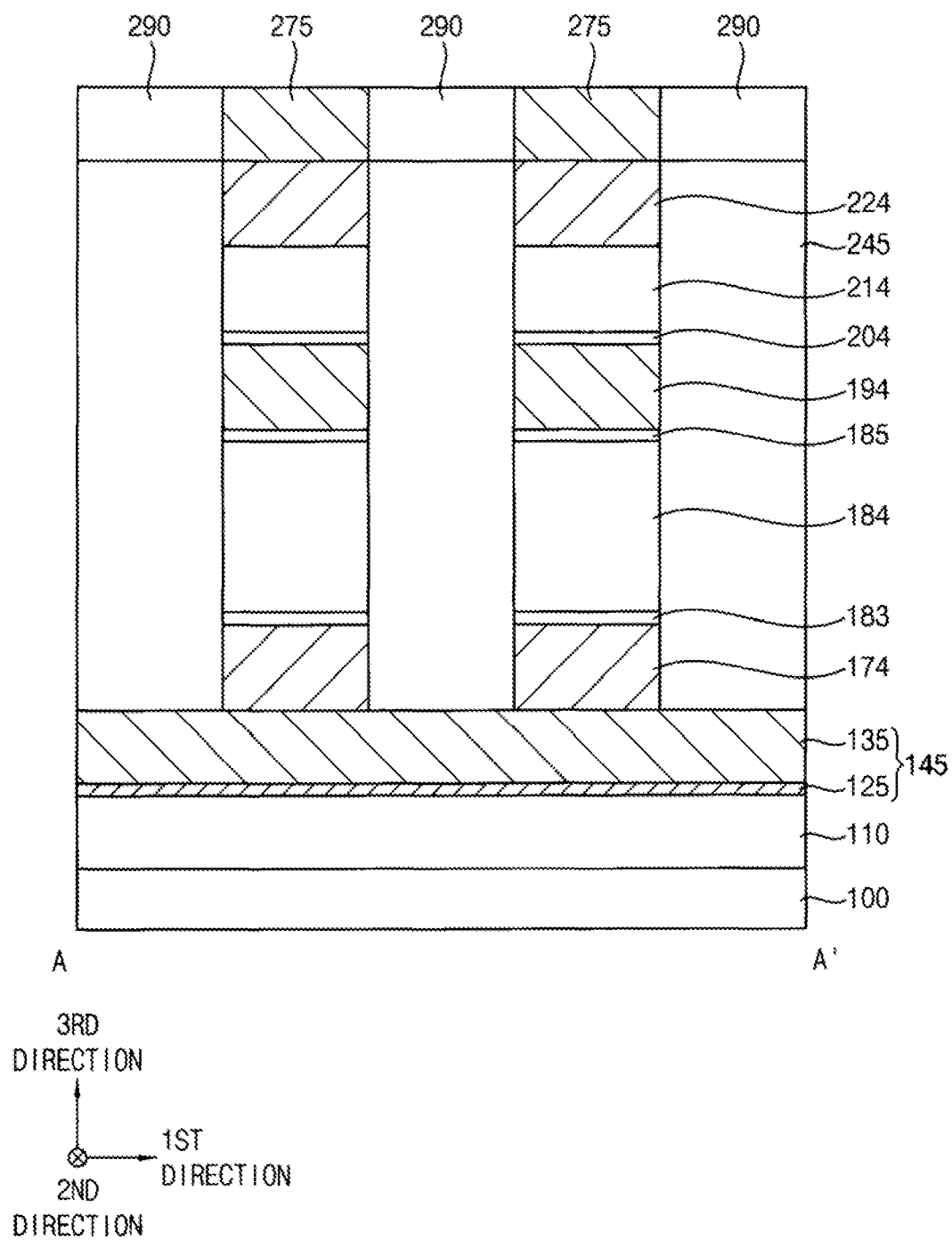

Referring to FIG. 22, the variable resistance memory device may include a memory unit, the selection pattern structure, and the third electrode 224 in each of areas where the first and second conductive lines 145 and 275 overlap each other in the third direction, respectively. The selection pattern structure may include the first leakage current prevention pattern 204 and the selection pattern 214 thereon, and the memory unit may include the first electrode 174, the first adiabatic pattern 183, the variable resistance pattern 184, the second adiabatic pattern 185, and the second electrode 194 sequentially stacked.

Figure 23:
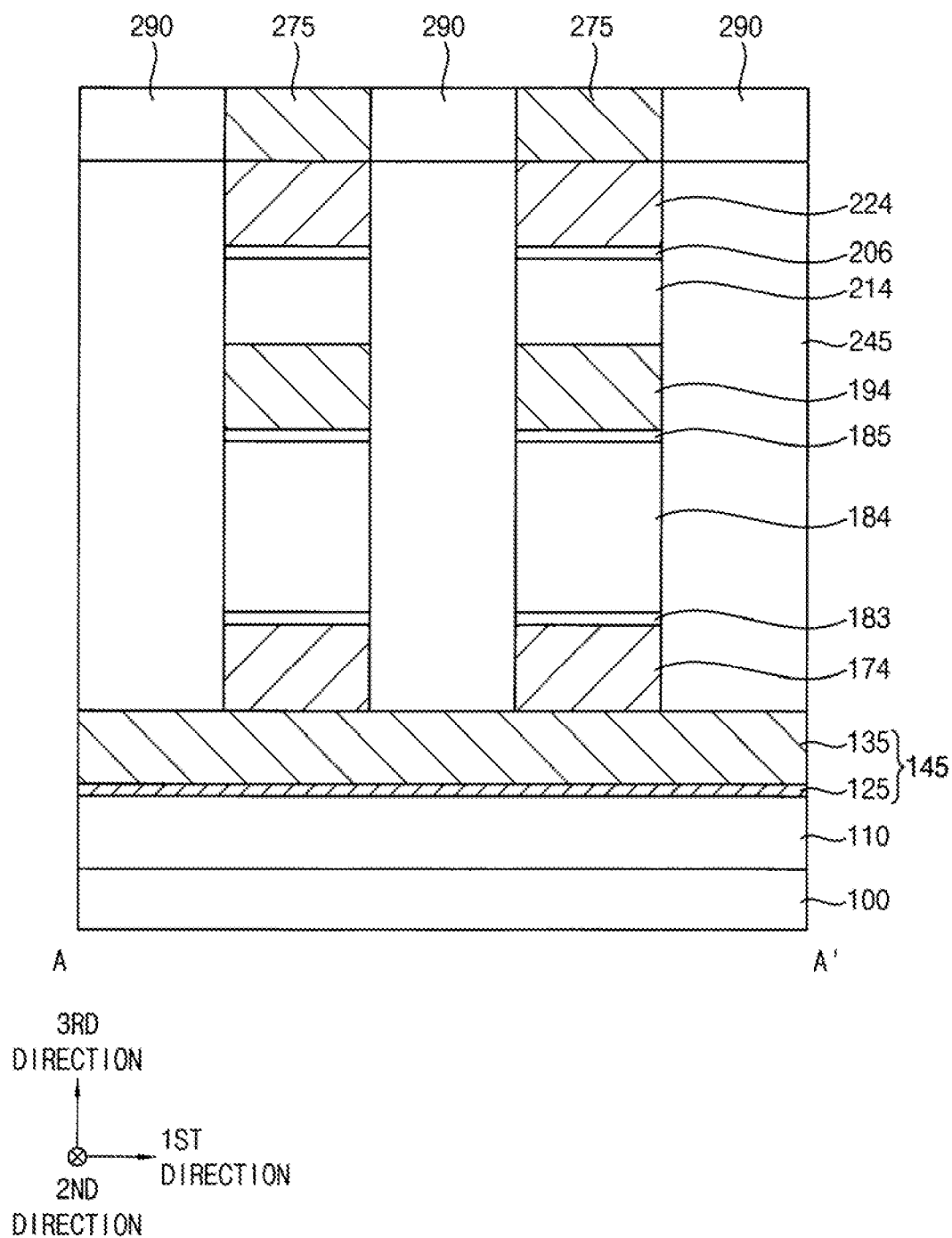

Referring to FIG. 23, the variable resistance memory device may include a memory unit, the selection pattern structure, and the third electrode 224 in each of areas where the first and second conductive lines 145 and 275 overlap each other in the third direction, respectively. The selection pattern structure may include the selection pattern 214 and the second leakage current prevention pattern 206 thereunder, and the memory unit may include the first electrode 174, the first adiabatic pattern 183, the variable resistance pattern 184, the second adiabatic pattern 185, and the second electrode 194 sequentially stacked.

Figure 24:
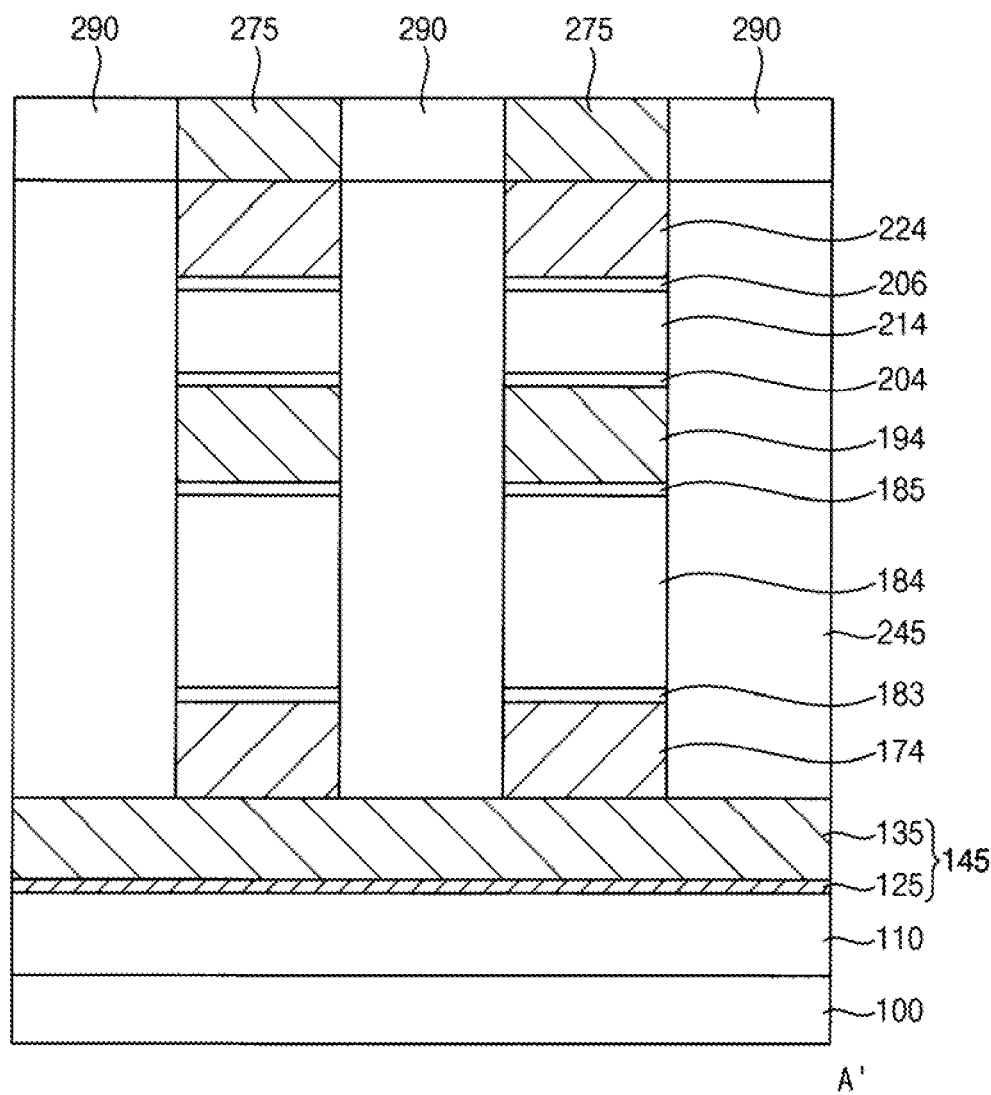
Figure 24:
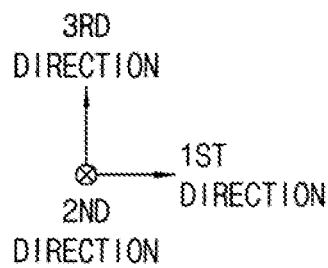

Referring to FIG. 24, the variable resistance memory device may include a memory unit, the selection pattern structure, and the third electrode 224 in each of areas where the first and second conductive lines 145 and 275 overlap each other in the third direction, respectively. The selection pattern structure may include the first leakage current prevention pattern 204, the selection pattern 214, and the second leakage current prevention pattern 206 sequentially stacked, and the memory unit may include the first electrode 174, the first adiabatic pattern 183, the variable resistance pattern 184, the second adiabatic pattern 185, and the second electrode 194 sequentially stacked.

Figure 25:
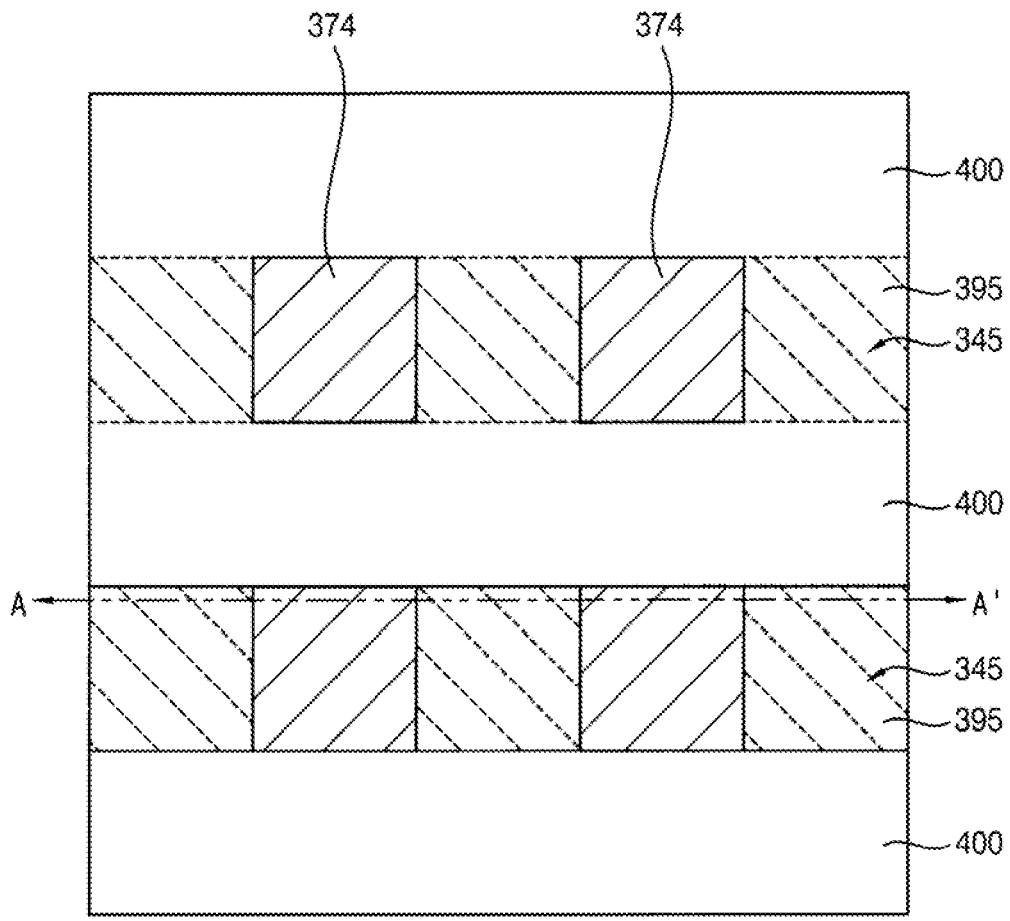
FIGS. 25 to 32 are plan views and cross-sectional views illustrating a method of manufacturing a variable resistance memory device in accordance with example embodiments.
Figure 29:
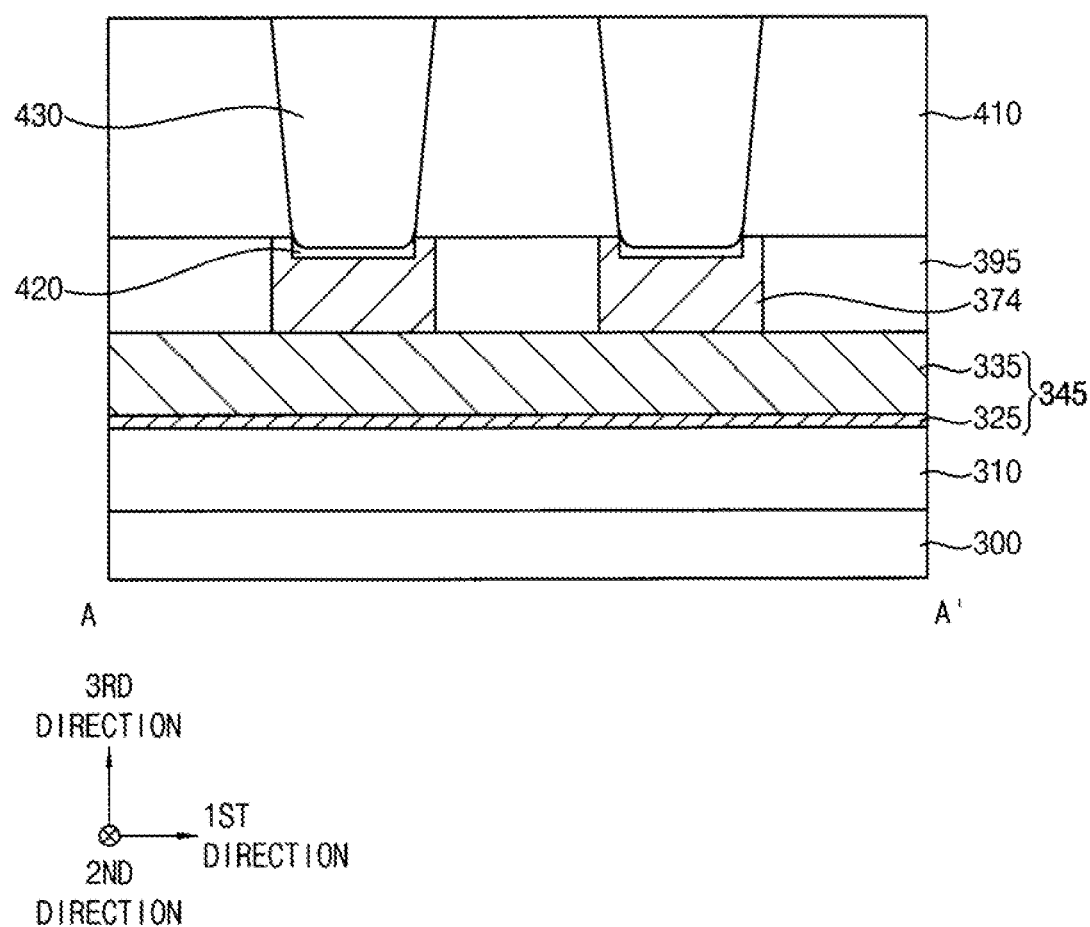
Figure 30:
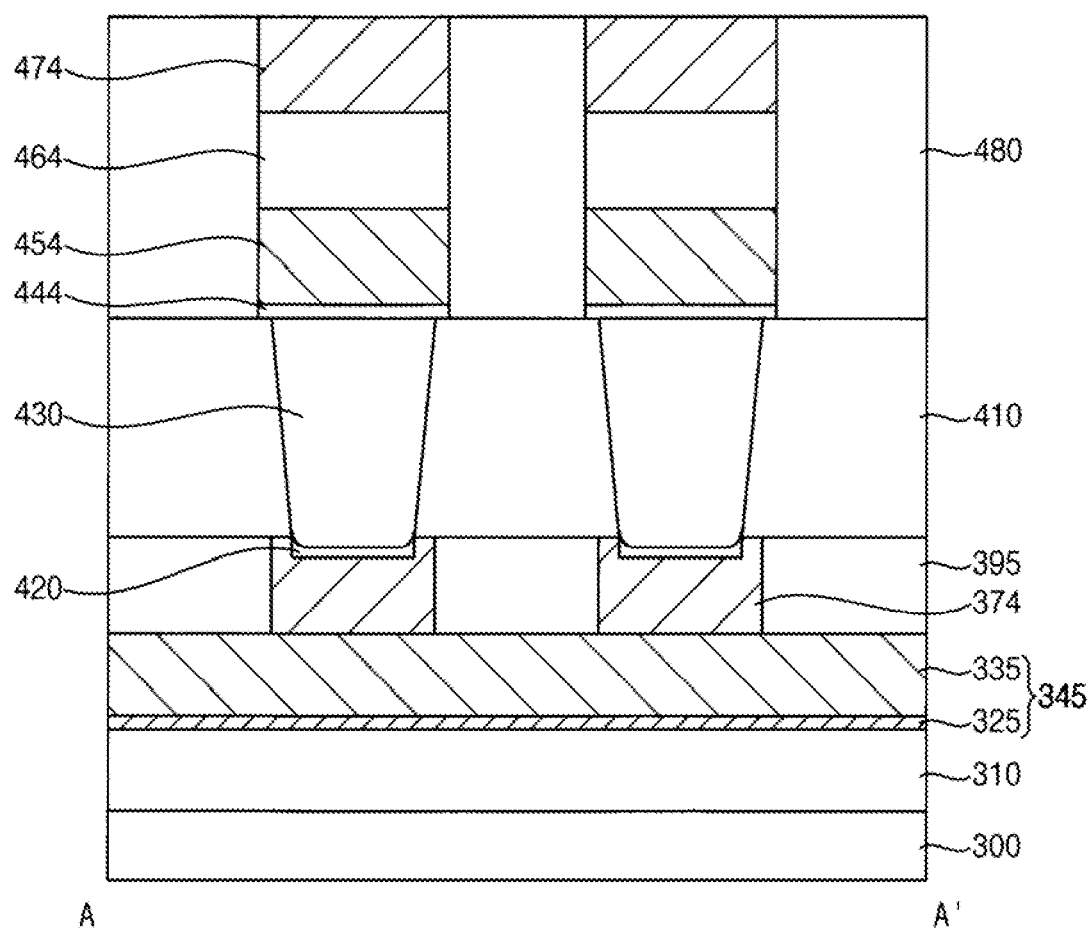
Figure 30:
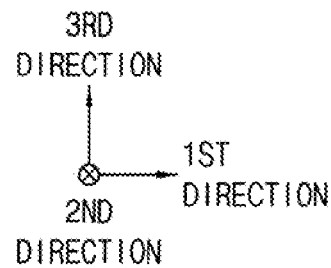
Figure 31:
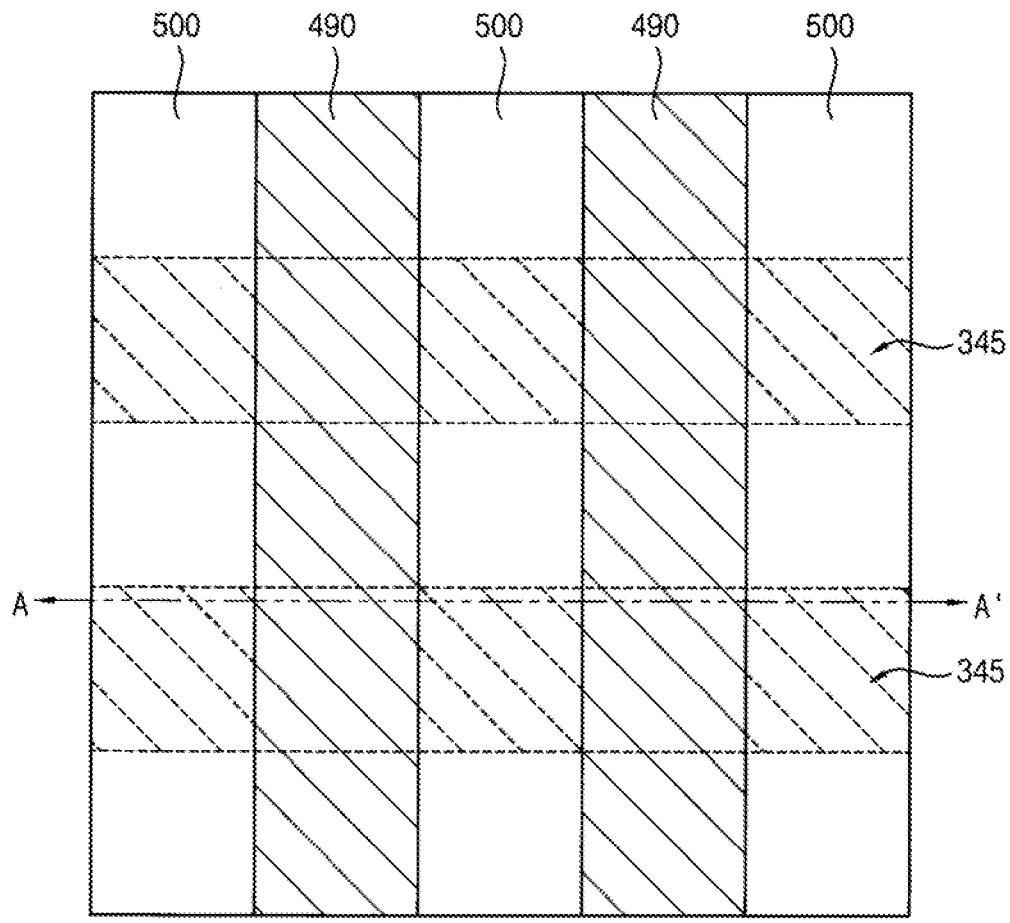

FIGS. 25 to 32 are plan views and cross-sectional views illustrating a method of manufacturing a variable resistance memory device in accordance with example embodiments. FIGS. 25 and 31 are plan views, and FIGS. 26-30 and 32 are cross-sectional views taken along lines A-A' of corresponding plan views, respectively.

This method may include processes substantially the same as or similar to those illustrated with reference to FIGS. 4 to 18 and FIGS. 1 to 3, and thus repeated explanations may be abbreviated or omitted.

Figure 26:
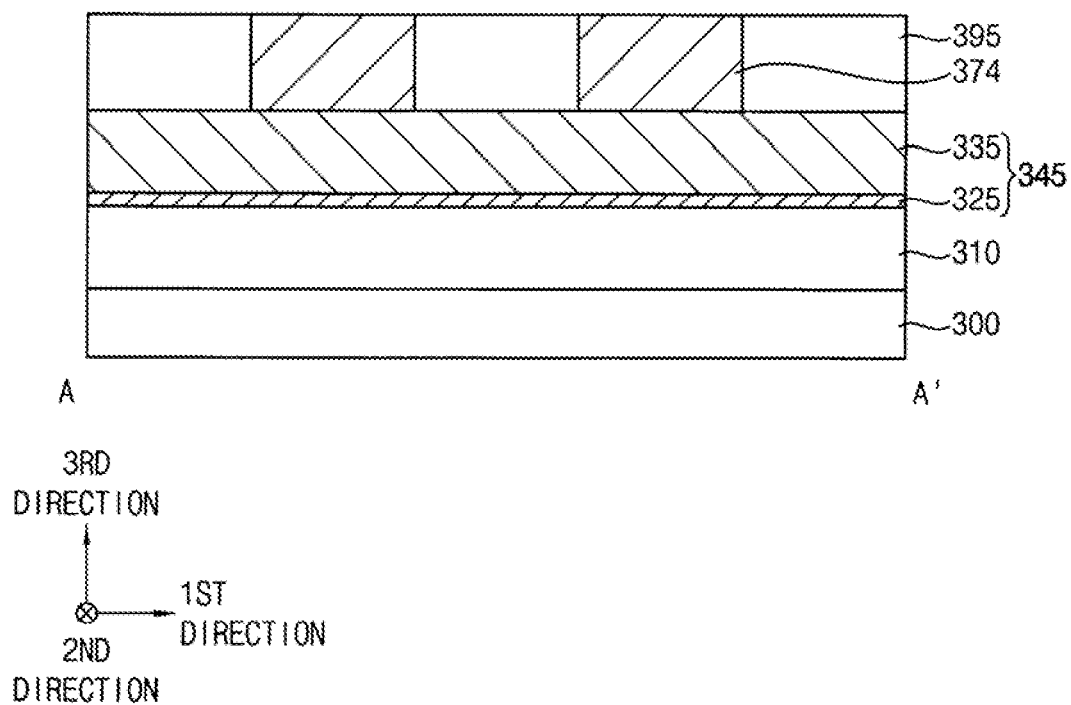

Referring to FIGS. 25 and 26, processes substantially the same as or similar to those illustrated with reference to FIGS. 4 to 18 may be performed.

For example, a first barrier layer and a first metal layer may be sequentially stacked on a first insulating interlayer 310 on a substrate 300, a fifth etching mask may be formed on the first metal layer, and the first barrier layer and the first metal layer may be sequentially etched using the fifth etching mask to form a first conductive line 345 including a first barrier pattern 325 and a first metal pattern 335 sequentially stacked. A first electrode layer may be formed on the first conductive line 345, and may be etched using sixth and seventh etching masks to form a first electrode 374.

The first conductive line 345 may extend in the first direction, and a plurality of first conductive lines 345 may be formed to be spaced apart from each other in the second direction. A second insulating interlayer line may be formed between ones of the first conductive lines 345 neighboring in the second direction.

In an example embodiment, a plurality of first electrodes 374 may be formed to be spaced apart from each other in each of the first and second directions. A third insulating interlayer pattern 395 may be formed between ones of the first electrodes 374 neighboring in the first direction, and a fourth insulating interlayer line 400 extending in the first direction may be formed between ones of the first electrodes 374 neighboring in the second direction and between ones of the third insulating interlayer patterns 395 neighboring in the second direction.

Figure 27:
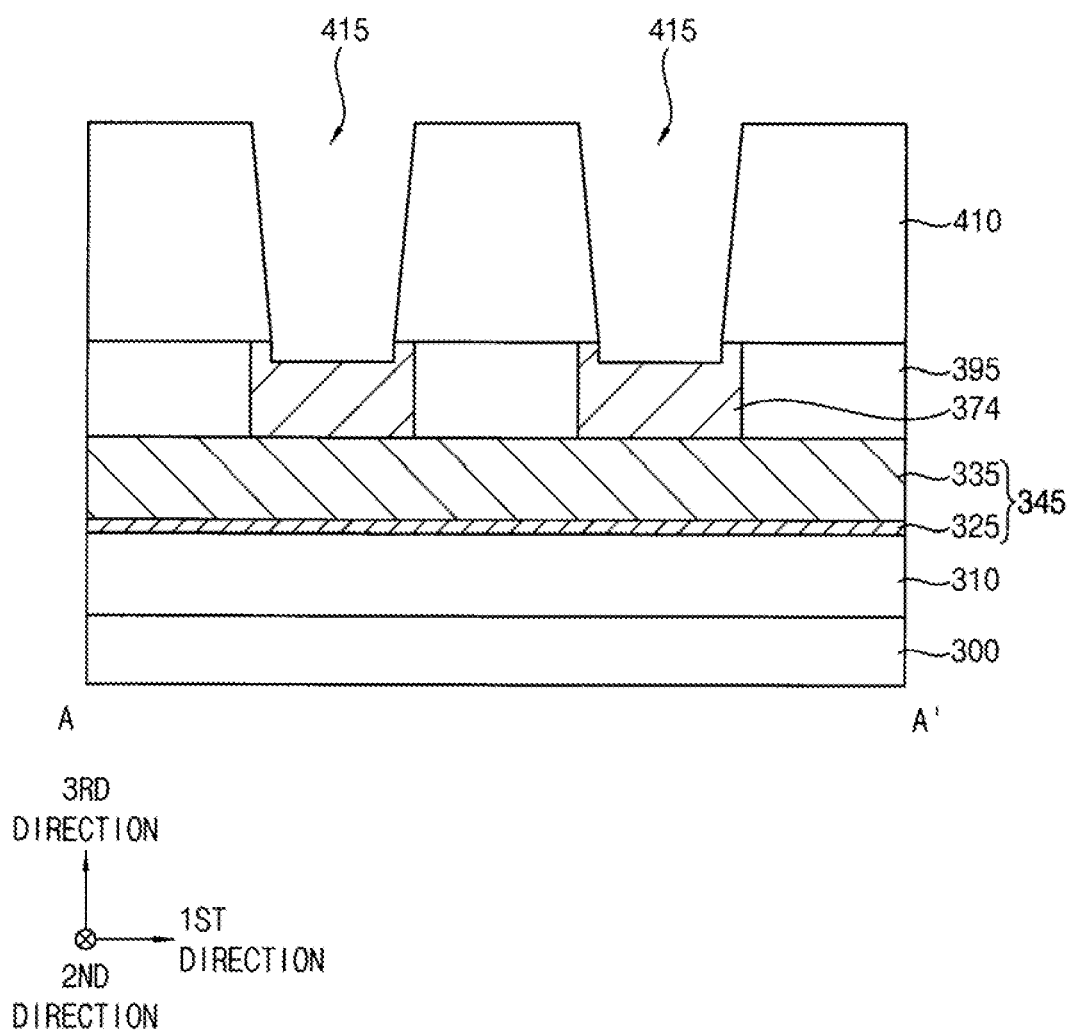

Referring to FIG. 27, a fifth insulating interlayer 410 may be formed on the first electrode 374, the third insulating interlayer pattern 395 and the fourth insulating interlayer line 400, and a recess 415 may be formed through the fifth insulating interlayer 410 to expose an upper surface of the first electrode 374.

During the formation of the recess 415, an upper portion of the first electrode 374 may be partially removed, and thus an upper surface of a central portion of the first electrode 374 may be lower than an upper surface of an edge portion of the first electrode 374.

In an example embodiment, the recess 415 may have a sidewall not perpendicular but slanted with respect to an upper surface of the substrate 300, and may have a width gradually decreasing from a top toward a bottom thereof. In an example embodiment, the recess 415 may have a shape of a circle or ellipse in a plan view.

The fifth insulating interlayer 410 may include an oxide, e.g., silicon oxide, or a nitride, e.g., silicon nitride.

Figure 28:
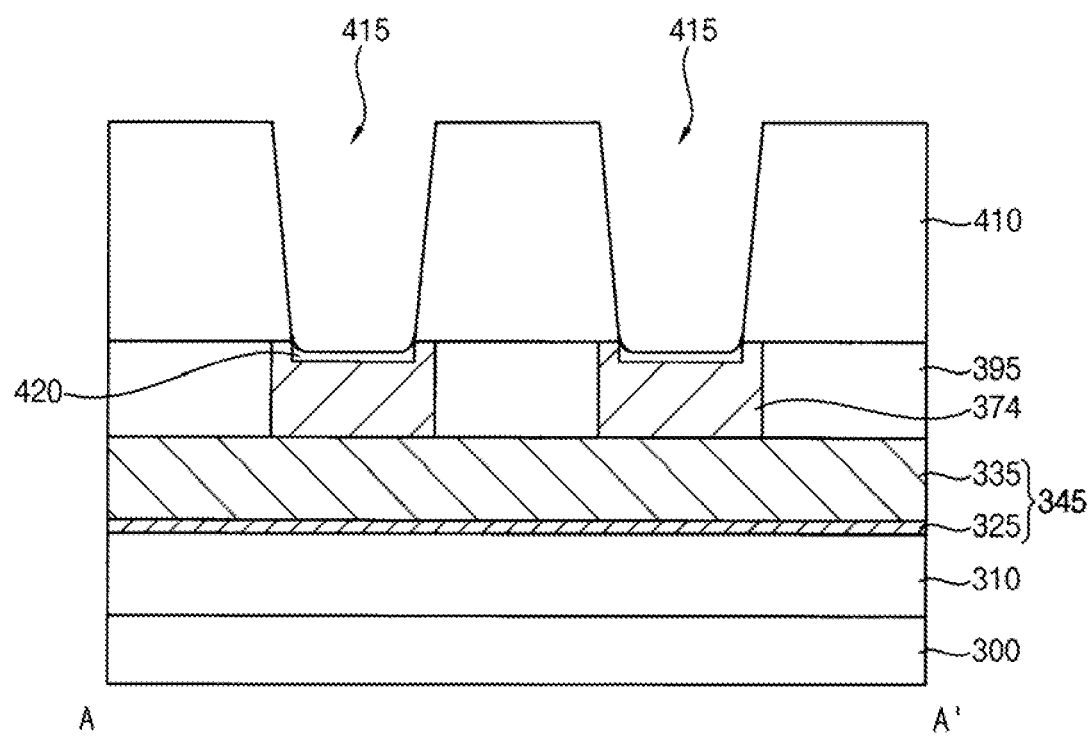
Figure 28:
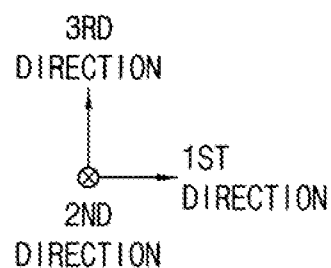

Referring to FIG. 28, a first adiabatic pattern 420 may be formed to cover the exposed upper surface of the first electrode 374 and fill a lower portion of the recess 415.

In an example embodiment, the first adiabatic pattern 420 may be formed by forming a first adiabatic layer including a transition metal, e.g., tungsten or molybdenum and performing a plasma treatment on the first adiabatic layer using, e.g., $H_2S$. In another implementation, the first adiabatic pattern 420 may be formed by performing a plasma treatment on the first adiabatic layer using, e.g., $H_2Se$.

In an example embodiment, the first adiabatic pattern 420 may be formed by forming a first adiabatic layer, oxidizing the first adiabatic layer to form a first adiabatic oxide layer including tungsten oxide or molybdenum oxide, and performing a plasma treatment on the first adiabatic oxide layer using, e.g., $H_2S$ plasma or $H_2Se$ plasma.

The first adiabatic pattern 420 may include substantially the same material as the first leakage current prevention pattern 204, e.g., a two-dimensional TMDC material.

In an example embodiment, an upper surface of the first adiabatic pattern 420 may be lower than an upper surface of an edge portion of the first electrode 374, and may have a concave shape.

Referring to FIG. 29, a variable resistance pattern 430 may be formed on the first adiabatic pattern 420 to fill the recess 415.

For example, the variable resistance pattern 430 may be formed by forming a variable resistance layer on the first adiabatic pattern 420 to fill the recess 415 and cover a sidewall and an upper surface of the fifth insulating interlayer 410, and planarizing the variable resistance layer, so that an upper surface of the variable resistance pattern 430 may be exposed.

The variable resistance layer may be formed by, e.g., a PVD process, a MBE process, an ALD process, a CVD process, a PECVD process, etc., and may include a phase-change material.

In an example embodiment, the first adiabatic pattern 420 and the variable resistance pattern 430 may be formed in-situ.

Referring to FIG. 30, processes substantially the same as or similar to those illustrated with reference to FIGS. 4 to 18 may be performed, so that a second adiabatic pattern 444, a second electrode 454, a selection pattern 464 and a third electrode 474 sequentially stacked are formed.

For example, a second adiabatic layer, a second electrode layer, a selection layer and a third electrode layer may be sequentially formed on the variable resistance pattern 430 and the fifth insulating interlayer 410, and may be etched using eighth and ninth etching masks, so that the second adiabatic pattern 444, the second electrode 454, the selection pattern 464 and the third electrode 474 may be formed. The second adiabatic pattern 444 may include substantially the same material as the first adiabatic pattern 420.

In an example embodiment, the second adiabatic pattern 444, the second electrode 454, the selection pattern 464 and the third electrode 474 may have substantially the same width, which may be greater than a width of an upper surface of the variable resistance pattern 430, so that the variable resistance pattern 430 may be separated from the second electrode 454, the selection pattern 464 and the third electrode 474 by the second adiabatic pattern 444.

In an example embodiment, a thickness of the second adiabatic pattern 444 may be substantially equal to a thickness of the first adiabatic pattern 420. In an example embodiment, the thickness of the second adiabatic pattern 444 may be less than a thickness of the second electrode 454.

The first electrode 374, the first adiabatic pattern 420, the variable resistance pattern 430, the second adiabatic pattern 444, and the second electrode 454 sequentially stacked may form a memory unit.

A sixth insulating interlayer pattern 480 may be formed to cover opposite sidewalls in the first direction of the second adiabatic pattern 444, the second electrode 454, the selection pattern 464 and the third electrode 474, and a seventh insulating interlayer line may be further formed to cover opposite sidewalls in the second direction of the second adiabatic pattern 444, the second electrode 454, the selection pattern 464, the third electrode 474 and the sixth insulating interlayer pattern 480.

Figure 32:
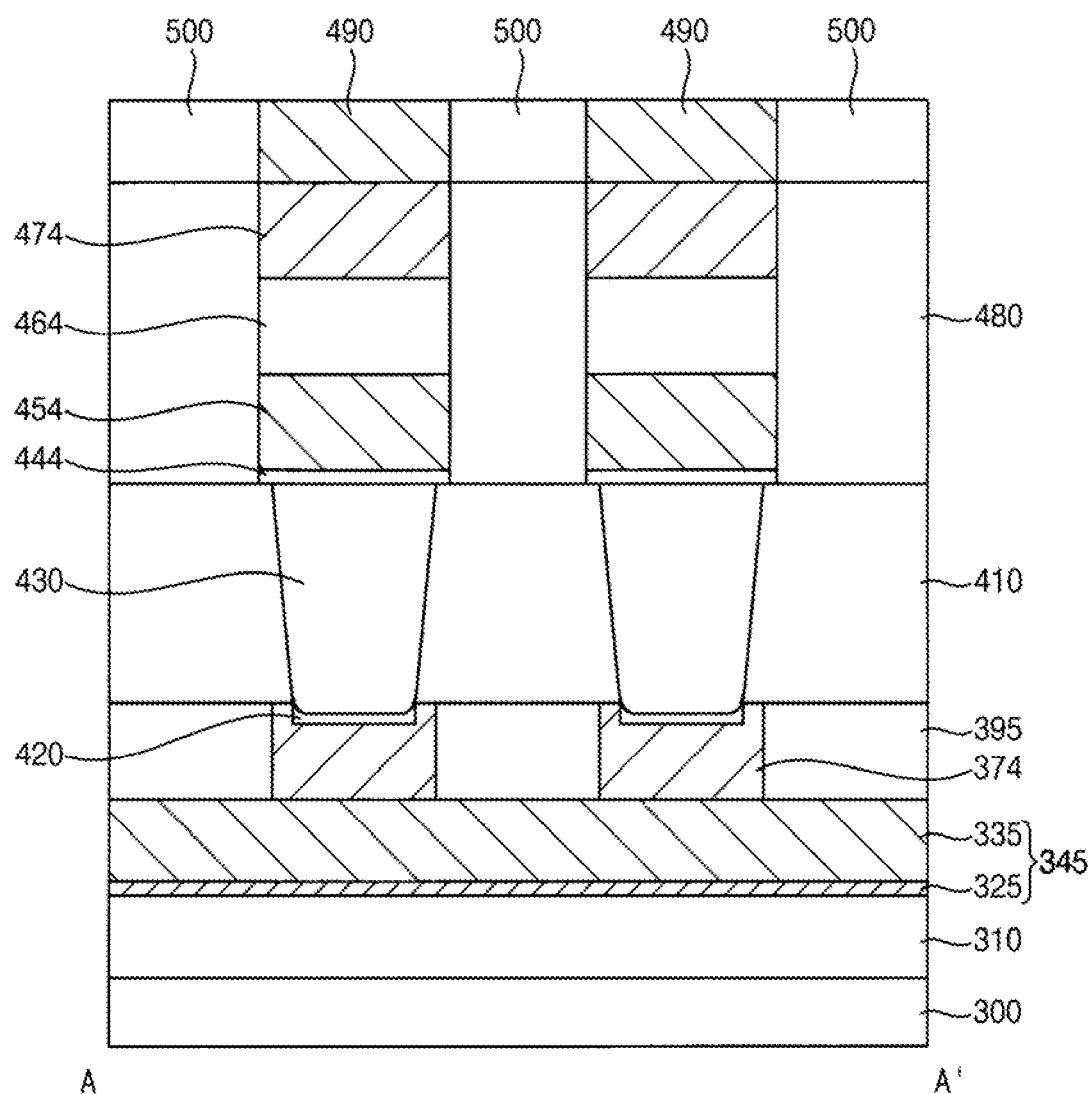

Referring to FIGS. 31 and 32, processes substantially the same as or similar to those illustrated with reference to FIGS. 1 to 3 may be performed, so that a second conductive line 490 and an eighth insulating interlayer line 500 may be formed on the third electrode 474, the sixth insulating interlayer pattern 480 and the seventh insulating interlayer line, and thus the fabrication of the variable resistance memory device may be completed.

Figure 33:
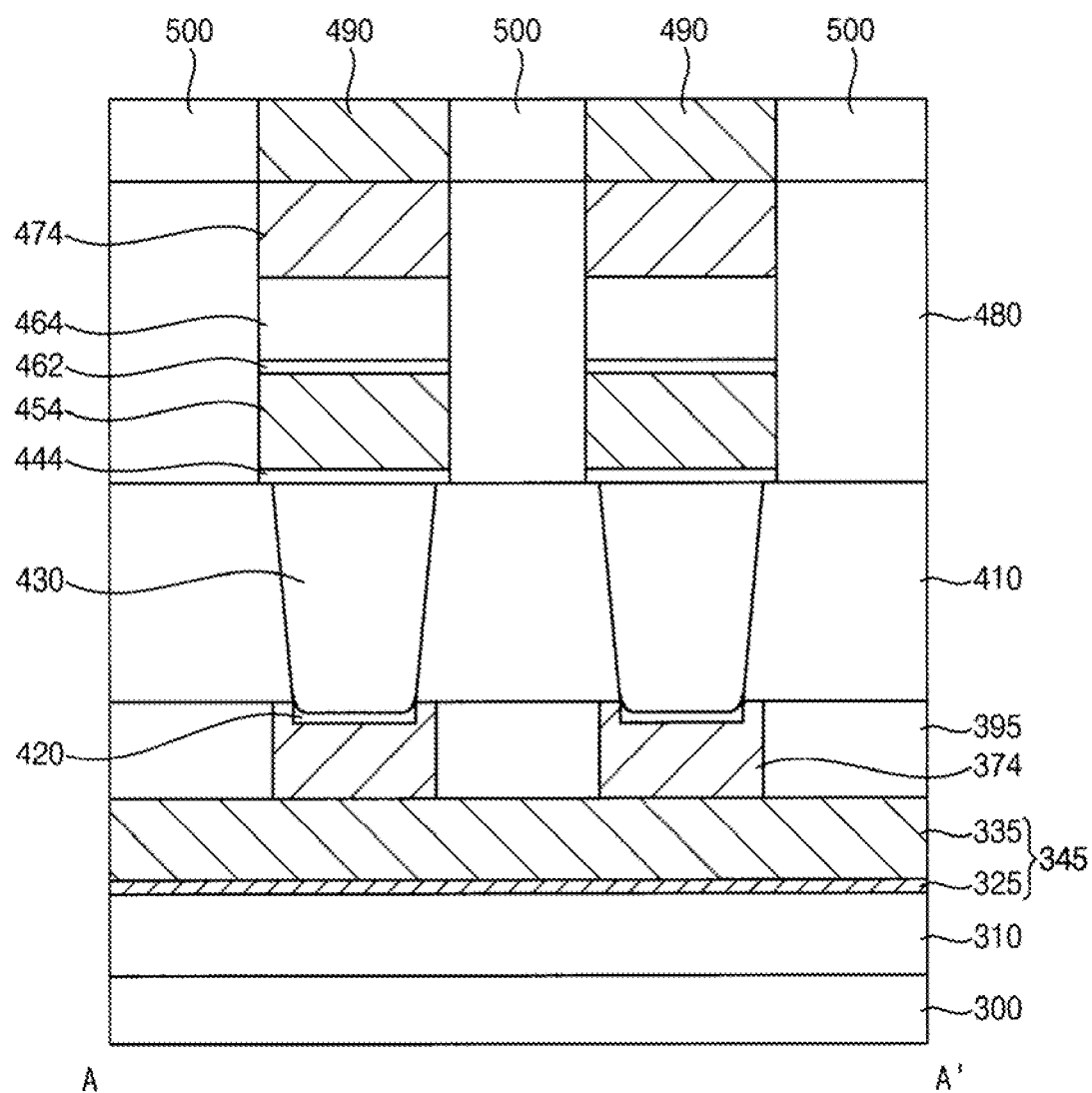
FIGS. 33 to 35 are cross-sectional views illustrating variable resistance memory devices in accordance with example embodiments.
Figure 34:
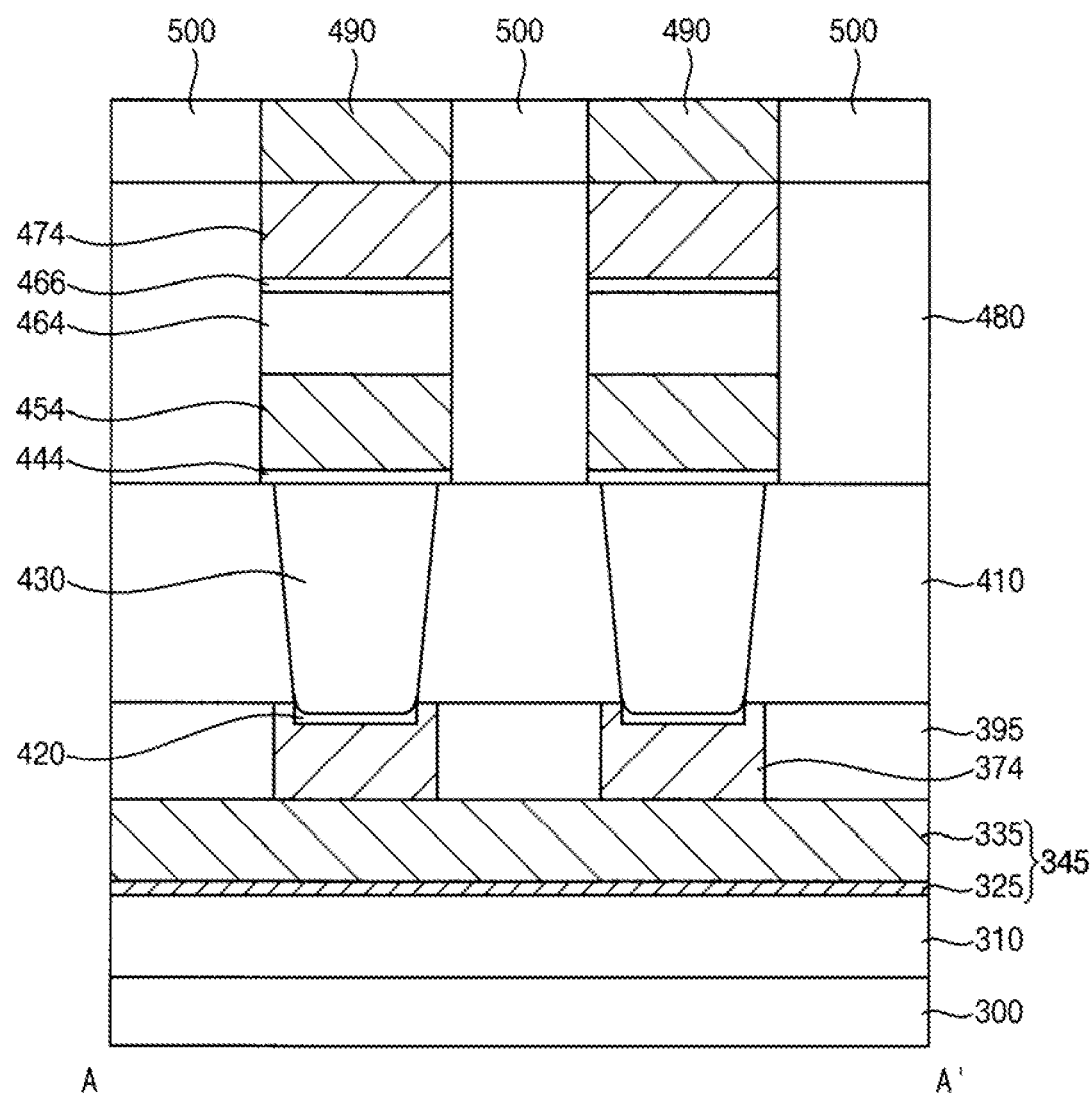
Figure 35:
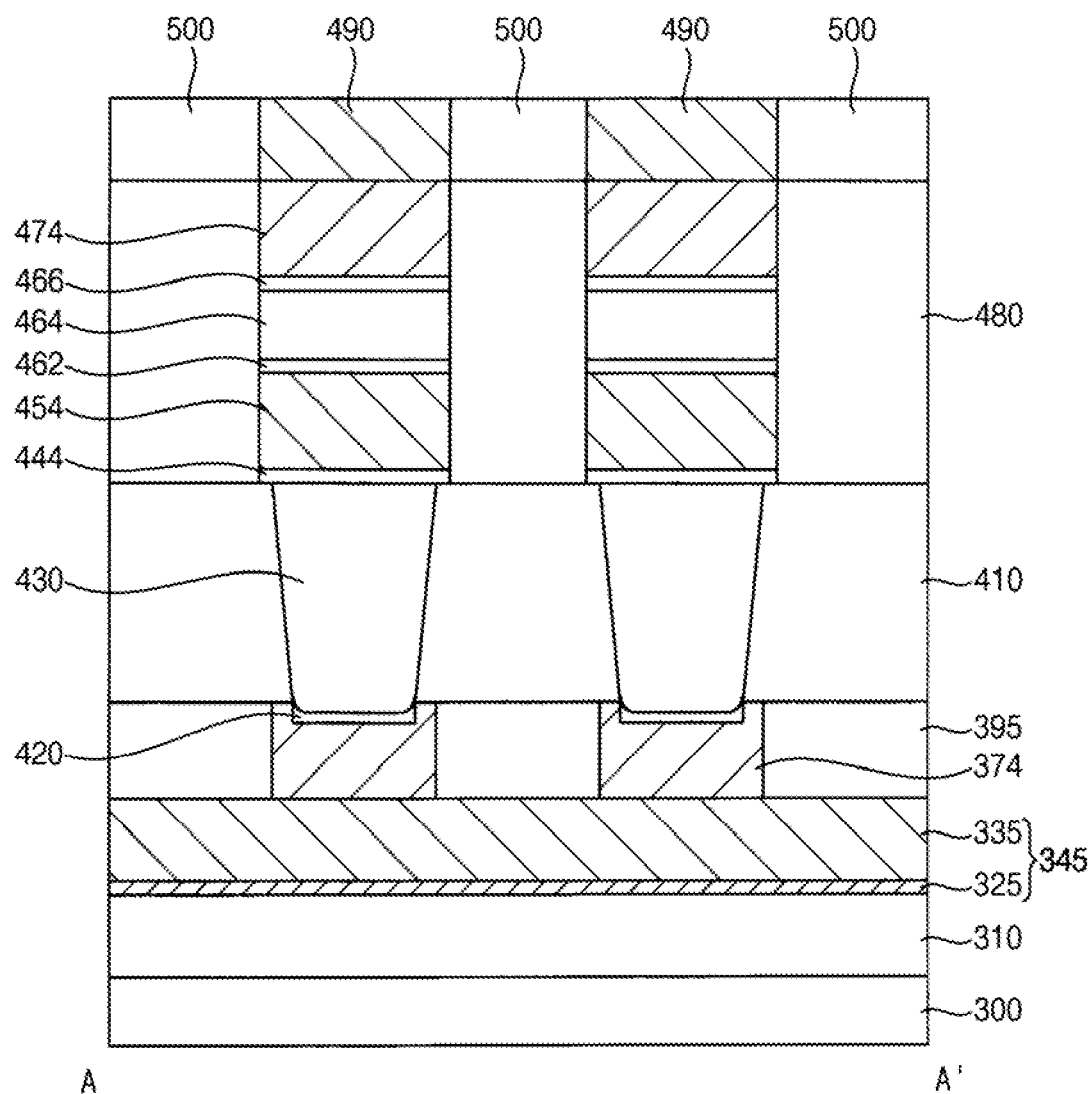

FIGS. 33 to 35 are cross-sectional views illustrating variable resistance memory devices in accordance with example embodiments. FIGS. 33 to 35 are cross-sectional views taken along a line A-A' of FIG. 31.

These variable resistance memory devices may be substantially the same as or similar to that of FIGS. 31 and 32, except for the selection pattern structure. Thus, like reference numerals refer to like elements, and repeated descriptions thereof may be abbreviated or omitted.

Referring to FIG. 33, the selection pattern structure between the second electrode 454 and the third electrode 474 may include the first leakage current prevention pattern 462 and the selection pattern 464 sequentially stacked.

Referring to FIG. 34, the selection pattern structure between the second electrode 454 and the third electrode 474 may include the selection pattern 464 and the second leakage current prevention pattern 466.

Referring to FIG. 35, the selection pattern structure between the second electrode 454 and the third electrode 474 may include the first leakage current prevention pattern 462, the selection pattern 464 and the second leakage current prevention pattern 466 sequentially stacked.

In an example embodiment, the first and second leakage current prevention patterns 462 and 466 may be formed only on the selection pattern 464 or only under the selection pattern 464, unlike the first and second adiabatic patterns 420 and 444 on and under, respectively, the variable resistance pattern 430.

By way of summation and review, if a selection pattern serving as a switch in a PRAM device has a high leakage current, the leakage current may pose challenges in a highly integrated PRAM device. Additionally, if large amounts of heat are generated during operation and transferred to a neighboring structure, the characteristics of the PRAM device may be deteriorated.

As described above, embodiments may provide a variable resistance memory device having improved characteristics.

In a variable resistance memory device according to an embodiment, a leakage current prevention pattern may be formed on or under a selection pattern, and may include a two-dimensional TMDC material. Thus, the leakage current prevention pattern may have a small electrical conductivity so as to reduce the leakage current from the selection pattern.

Additionally, the variable resistance memory device according to an embodiment may include first and second adiabatic patterns on and under, respectively, a variable resistance pattern of the memory unit, and each of the first and second adiabatic patterns may include a two-dimensional TMDC material. Accordingly, heat generated from the variable resistance pattern may be prevented from conducting to neighboring structures.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
   first conductive lines on a substrate, each of the first conductive lines extending in a first direction substantially parallel to an upper surface of the substrate, the first conductive lines being spaced apart from each other in a second direction substantially parallel to the upper surface of the substrate, and the first and second directions crossing each other;
   second conductive lines on the first conductive lines, each of the second conductive lines extending in the second direction, and the second conductive lines being spaced apart from each other in the first direction; and
   a first electrode, a memory unit, a second electrode, a selection pattern structure, and a third electrode disposed in respective areas where the first and second conductive lines overlap each other in a third direction substantially perpendicular to the upper surface of the substrate, wherein:
   the memory unit includes a first adiabatic pattern, a phase change pattern, and a second adiabatic pattern sequentially stacked such that the phase change pattern directly contacts the first adiabatic pattern and directly contacts the second adiabatic pattern,
   the selection pattern structure includes a first leakage current prevention pattern and a selection pattern sequentially stacked,
   each of the first adiabatic pattern, the second adiabatic pattern, and the first leakage current prevention pattern includes a two-dimensional transition metal dichalcogenide (TMDC) material.

2. The variable resistance memory device as claimed in claim 1, wherein each of the first adiabatic pattern, the second adiabatic pattern, and the first leakage current prevention pattern includes a material represented by $MX_2$ in which M is a transition metal that includes at least one of niobium, vanadium, tantalum, titanium, zirconium, hafnium, technetium, platinum, and rhenium, and X is a chalcogenide that includes at least one of sulfur, selenium, and tellurium.

3. The variable resistance memory device as claimed in claim 1, wherein the selection pattern structure further includes a second leakage current prevention pattern on the selection pattern, the second leakage current prevention pattern including a two-dimensional TMDC material, which is optionally substantially the same material as the first leakage current prevention pattern.

4. The variable resistance memory device as claimed in claim 1, wherein the first conductive lines are word lines, and the second conductive lines are bit lines.

5. The variable resistance memory device as claimed in claim 2, wherein the TMDC material includes at least one of $ZrS_2$, $ZrSe_2$, $HfS_2$, $HfSe_2$, $NbSe_2$ and $ReSe_2$.

6. The variable resistance memory device as claimed in claim 1, wherein the TMDC material is represented by $MX_2$, M being a transition metal, and X being a chalcogenide.

7. The variable resistance memory device as claimed in claim 6, wherein:
the transition metal includes at least one of molybdenum, tungsten, niobium, vanadium, tantalum, titanium, zirconium, hafnium, technetium, platinum, and rhenium, and
the chalcogenide includes at least one of sulfur, selenium, and tellurium.

8. The variable resistance memory device as claimed in claim 6, wherein the TMDC material includes at least one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$ and $ReSe_2$.

9. The variable resistance memory device as claimed in claim 8, wherein:
the TMDC material has first and second layers sequentially stacked, the first and second layers including $MoS_2$ and $MoSe_2$, respectively, or
the TMDC material has third and fourth layers sequentially stacked, the third and fourth layers including $WSe_2$ and $MoS_2$, respectively.

10. The variable resistance memory device as claimed in claim 1, wherein:
the selection pattern includes an ovonic threshold switch (OTS) material, the OTS material containing at least one of germanium (Ge), selenium (Se), arsenic (As) and silicon (Si), and
the phase change pattern includes a chalcogenide material in which germanium (Ge), antimony (Sb) and/or tellurium (Te) are combined in a predetermined ratio.

* * * * *